US012080515B2

(12) United States Patent
Ren et al.

(10) Patent No.: US 12,080,515 B2
(45) Date of Patent: Sep. 3, 2024

(54) APPARATUS FOR MULTIPLE CHARGED-PARTICLE BEAMS

(71) Applicant: ASML Netherlands B.V., Veldhoven (NL)

(72) Inventors: Weiming Ren, San Jose, CA (US); Xuedong Liu, San Jose, CA (US); Xuerang Hu, San Jose, CA (US); Zong-wei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 229 days.

(21) Appl. No.: 17/718,225

(22) Filed: Apr. 11, 2022

(65) Prior Publication Data

US 2022/0246395 A1 Aug. 4, 2022

Related U.S. Application Data

(63) Continuation of application No. 16/536,284, filed on Aug. 8, 2019, now Pat. No. 11,302,514.

(Continued)

(51) Int. Cl.
 *H01J 37/28* (2006.01)
 *H01J 37/06* (2006.01)
 (Continued)

(52) U.S. Cl.
 CPC .............. *H01J 37/28* (2013.01); *H01J 37/06* (2013.01); *H01J 37/10* (2013.01);
 (Continued)

(58) Field of Classification Search
 CPC .............. H01J 37/28; H01J 2237/0453; H01J 2237/1534; H01J 37/1472;
 (Continued)

(56) References Cited

U.S. PATENT DOCUMENTS 9,035,249 B1 5/2015 Frosien et al.
9,691,586 B2 6/2017 Ren et al.
(Continued)

FOREIGN PATENT DOCUMENTS

CN 108292583 A 7/2018
EP 1 627 412 B1 4/2007
(Continued)

OTHER PUBLICATIONS

Notification of Reason(s) for Refusal issued in related Korean Patent Application No. 10-2021-7003844; mailed Oct. 18, 2022 (12 pgs.).

(Continued)

*Primary Examiner* — David A Vanore
(74) *Attorney, Agent, or Firm* — Finnegan, Henderson, Farabow, Garrett & Dunner, LLP

(57) ABSTRACT

Systems and methods for observing a sample in a multi-beam apparatus are disclosed. A charged particle optical system may include a deflector configured to form a virtual image of a charged particle source and a transfer lens configured to form a real image of the charged particle source on an image plane. The image plane may be formed at least near a beam separator that is configured to separate primary charged particles generated by the source and secondary charged particles generated by interaction of the primary charged particles with a sample. The image plane may be formed at a deflection plane of the beam separator. The multi-beam apparatus may include a charged-particle dispersion compensator to compensate dispersion of the beam separator. The image plane may be formed closer to the transfer lens than the beam separator, between the transfer lens and the charged-particle dispersion compensator.

20 Claims, 17 Drawing Sheets

Related U.S. Application Data

(60) Provisional application No. 62/827,765, filed on Apr. 1, 2019, provisional application No. 62/716,832, filed on Aug. 9, 2018.

(51) Int. Cl.
   *H01J 37/10* (2006.01)
   *H01J 37/147* (2006.01)

(52) U.S. Cl.
   CPC ... *H01J 37/1474* (2013.01); *H01J 2237/0492* (2013.01); *H01J 2237/083* (2013.01); *H01J 2237/1501* (2013.01); *H01J 2237/2806* (2013.01)

(58) Field of Classification Search
   CPC ....... H01J 2237/1205; H01J 2237/0492; H01J 37/145; H01J 37/1474; H01J 2237/0435; H01J 37/04; H01J 37/045; H01J 2237/21; H01J 2237/0635; H01J 2237/103; H01J 2237/31774; H01J 2237/04; H01J 2237/043; H01J 2237/0455; H01J 2237/26; H01J 2237/28; H01J 37/1475; H01J 37/1477; H01J 37/26; H01J 37/3007

See application file for complete search history.

(56) References Cited

U.S. PATENT DOCUMENTS

| | | | |
|---|---|---|---|
| 9,922,796 B1 | 3/2018 | Frosien et al. | |
| 9,922,799 B2 | 3/2018 | Li et al. | |
| 10,483,080 B1 | 11/2019 | Cook et al. | |
| 2006/0060790 A1 | 3/2006 | Nakasuji et al. | |
| 2006/0169910 A1 | 8/2006 | Frosien et al. | |
| 2008/0023643 A1* | 1/2008 | Kruit ................. | H01J 37/12 250/396 R |
| 2008/0067376 A1 | 3/2008 | Tanimoto et al. | |
| 2009/0114818 A1 | 5/2009 | Casares et al. | |
| 2010/0065753 A1 | 3/2010 | Enyama et al. | |
| 2010/0133433 A1 | 6/2010 | Tanimoto et al. | |
| 2010/0148087 A1 | 6/2010 | Doering et al. | |
| 2010/0178602 A1 | 7/2010 | Seto et al. | |
| 2010/0320382 A1 | 12/2010 | Almogy et al. | |
| 2011/0079730 A1 | 4/2011 | Wieland | |
| 2011/0163229 A1 | 7/2011 | Frosien et al. | |
| 2011/0272576 A1 | 11/2011 | Otaki et al. | |
| 2012/0061565 A1 | 3/2012 | Enyama et al. | |
| 2012/0091358 A1 | 4/2012 | Wieland et al. | |
| 2013/0277554 A1 | 10/2013 | Ren et al. | |
| 2013/0299697 A1 | 11/2013 | Enyama et al. | |
| 2014/0014852 A1 | 1/2014 | Wieland et al. | |
| 2016/0071696 A1 | 3/2016 | Kuiper et al. | |
| 2016/0268096 A1 | 9/2016 | Ren et al. | |
| 2016/0284505 A1* | 9/2016 | Ren .................. | H01J 37/28 |
| 2016/0336142 A1 | 11/2016 | Liu et al. | |
| 2017/0025241 A1* | 1/2017 | Li ..................... | H01J 37/10 |
| 2017/0025243 A1 | 1/2017 | Ren et al. | |
| 2017/0154756 A1* | 6/2017 | Ren .................. | H01J 37/141 |
| 2017/0213688 A1* | 7/2017 | Ren .................. | H01J 37/28 |
| 2017/0287674 A1 | 10/2017 | Knippelmeyer et al. | |
| 2018/0024082 A1 | 1/2018 | Ando | |
| 2018/0254167 A1* | 9/2018 | Zhao ................. | H01J 37/20 |
| 2018/0350555 A1* | 12/2018 | Li ..................... | H01J 37/28 |
| 2019/0035595 A1 | 1/2019 | Ren et al. | |
| 2019/0066972 A1 | 2/2019 | Frosien | |
| 2019/0279844 A1 | 9/2019 | Ren et al. | |
| 2019/0333732 A1 | 10/2019 | Ren et al. | |
| 2019/0341222 A1 | 11/2019 | Hu et al. | |
| 2019/0355545 A1* | 11/2019 | Zeidler ............... | H01J 37/21 |
| 2019/0355546 A1 | 11/2019 | Ando et al. | |
| 2019/0355547 A1 | 11/2019 | Ando et al. | |
| 2019/0369035 A1 | 12/2019 | Tsuchiya et al. | |
| 2020/0006031 A1 | 1/2020 | Izumi et al. | |
| 2020/0051779 A1 | 2/2020 | Ren et al. | |
| 2020/0126751 A1* | 4/2020 | Kemen ............... | H01J 37/07 |
| 2020/0243300 A1* | 7/2020 | Zeidler ............... | H01J 37/265 |
| 2021/0193437 A1* | 6/2021 | Ren .................. | H01J 37/244 |
| 2022/0246395 A1* | 8/2022 | Ren .................. | H01J 37/04 |
| 2023/0395349 A1* | 12/2023 | Jiang ................ | H01J 37/22 |

FOREIGN PATENT DOCUMENTS

| | | |
|---|---|---|
| EP | 2 402 979 A2 | 1/2012 |
| JP | 2007500948 A | 1/2007 |
| JP | 2007-317467 A | 12/2007 |
| JP | 2013-196951 A | 9/2013 |
| JP | 2018513543 A | 5/2018 |
| WO | WO 2004/107050 A2 | 12/2004 |
| WO | WO 2016/145458 A1 | 9/2016 |
| WO | WO 2018/122176 A1 | 7/2018 |
| WO | WO 2019/068666 A1 | 4/2019 |

OTHER PUBLICATIONS

Notice of Reasons for Rejection issued in related Japanese Patent Application No. 2021-503887; mailed Apr. 8, 2022 (8 pgs.).

M. Miyoshi et al., "Development of a projection imaging electron microscope with electrostatic lenses", Journal of Vacuum Science & Technology B; Microelectronics and Nanometer Structures Processing, Measurement, and Phenomena>vol. 17; Issue 6> 10.116/1.591069; Dec. 2, 1999; https:/doi.org/10.1116/1.591069 (abstract).

International Search Report issued in related International Application No. PCT/EP2019/070566, mailed Jan. 3, 2020 (3 pgs.).

Office Action issued by the ROC (Taiwan) Patent Office in related Taiwanese Application No. 108128245, mailed Apr. 29, 2020 (12 pgs.).

Decision of Rejection issued in related Japanese Patent Application No. 2021-503887; mailed Dec. 5, 2022 (5 pgs.).

* cited by examiner

APPARATUS FOR MULTIPLE CHARGED-PARTICLE BEAMS

CROSS-REFERENCE TO RELATED APPLICATIONS

This application is a divisional of application Ser. No. 16/536,284, filed Aug. 8, 2019, which claims priority of U.S. application 62/716,832, which was filed on Aug. 9, 2018, and of U.S. application 62/827,765 which was filed on Apr. 1, 2019. The disclosures of the above-referenced applications are incorporated herein by reference in their entireties.

TECHNICAL FIELD

The embodiments provided herein disclose a multi-beam apparatus, such as an electron microscopy apparatus utilizing one or more electron beams, and more particularly a multi-beam electron microscope with reduced beam dispersion, such as by reducing Coulomb interaction effects or by use of a transfer lens, among others.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more and more important. Multiple charged-particle beams may be used to increase the inspection throughput; however, in doing so, the imaging resolution of the apparatus may be compromised, rendering the inspection tools inadequate for their desired purpose.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. In a SEM tool, a beam of primary electrons having a relatively high energy is decelerated to land on a sample at a relatively low landing energy and is focused to form a probe spot thereon. Due to this focused probe spot of primary electrons, secondary electrons will be generated from the surface. By scanning the probe spot over the sample surface and collecting the secondary electrons, pattern inspection tools may obtain an image of the sample surface.

Optical components, such as beam separators, lenses, beam deflectors, etc. within single or multi-beam inspection tools may introduce dispersion in beams that are used for inspection. For example, a beam of primary electrons may be generated along an optical axis while a detector for collecting secondary electrons is placed off-axis, in an inspection system comprising multiple primary beams or multiple secondary beams, a beam separator may be used to separate beams of secondary electrons from the primary beams and direct the secondary beams toward the off-axis detector. Because a beam separator may comprise a magnetic deflector that is used to deflect electrons using electromagnetism, the beam separator may generate dispersion in beams passing therethrough. Dispersion may reduce resolution for reconstructing images of the inspected sample surface, among other effects.

SUMMARY

Embodiments of the present disclosure may provide a charged particle optical system that may include a deflector configured to form a virtual image of a charged particle source and a transfer lens configured to form a real image of the charged particle, source on an image plane. The image plane may be formed at least near a beam separator that is configured to separate primary charged particles generated by the charged particle source and secondary charged particles generated by interaction of the primary charged particles with a sample. The image plane may be formed at a deflection plane of the beam separator. The particle-optical system may be useful for reducing dispersion influence of the beam separator.

In some embodiments, there may be provided a charged particle optical system including a first deflector array configured to deflect a plurality of beamlets of a primary charged particle beam generated by a source, a first lens configured to focus the plurality of beamlets to form a plurality of images of the source on an image plane, and an objective lens configured to project the plurality of images onto a sample and form a plurality of probe spots on the sample. The first deflector array may include an image-forming element array. The first lens may include a transfer lens.

In some embodiments, there may also be provided a first aperture array above the first deflector array and configured to limit currents of the plurality of probe spots. The first aperture array may include a beam-limit aperture array.

In some embodiments, there may also be provided a second lens between the charged particle source and the first aperture array and configured to focus the primary charged particle beam. The second lens may include a condenser lens. The second lens may include a movable lens or an anti-rotation lens.

In some embodiments, there may also be provided a compensator array configured to compensate aberrations of the plurality of probe spots. The compensator array may include an aberration compensator array, an astigmatism compensator array, or a field curvature array.

In some embodiments, there may also be provided a main aperture above the second lens, close to the source and configured to cut off a peripheral portion of the primary charged particle beam not used in the plurality of beamlets.

In some embodiments, there may also be provided a second aperture array. The second aperture array may be between the main aperture and the first aperture array and configured to cut off portions of the primary charged particle beam not used in the plurality of beamlets. The second aperture array may include a pre-beamlet-forming mechanism that may include a Coulomb aperture array.

In some embodiments, there may also be provided a second deflector array configured to deflect the plurality of beamlets to be normally incident onto the first aperture array. The second deflector array may include a pre-beamlet-bending deflector array.

In some embodiments, there may be provided a charged particle optical system including a first deflector configured to deflect a beamlet of a charged particle beam generated by a charged particle source, and a first lens configured to focus the beamlet to form an image of the charged particle source on an image plane within a region of a beam separator that is configured to separate the beamlet and secondary charged particles generated from a sample in response to charged particles of the beamlet interacting with the sample. The first deflector may be a part of an image-forming element array. The first lens may be a transfer lens.

In some embodiments, there may be provided a method of forming a plurality of probe spots on a sample that includes deflecting a plurality of beamlets of a beam generated by a charged particle source, focusing the plurality of beamlets, by a lens, to form a plurality of images of the source on an image plane, and projecting the plurality of images onto a sample to form a plurality of probe spots on the sample. The lens may be a transfer lens.

Some embodiments of the present disclosure may provide a multi-beam apparatus that may include a first lens configured to focus a plurality of beamlets to form a plurality of images of a charged-particle source on an image plane formed closer to the first lens than a charged-particle separator that is configured to separate primary charged particles of the plurality of beamlets and secondary charged particles emitted from a sample. The apparatus may further include an objective semis configured to project the plurality of m ages onto the sample and form a plurality of probe spots thereon.

In some embodiments, the multi-beam apparatus may include a first deflector array configured to deflect at least one of the plurality of beamlets of a primary charged-particle beam radially outward from a primary optical axis and incident on the first lens, and wherein the image plane is formed normal to the primary optical axis of the primary charged-particle beam and between the first lens and the charged-particle separator. The apparatus may further include a second lens disposed between the charged-particle source and the first lens and configured to focus the primary charged-particle beam. The apparatus may also include a charged-particle dispersion compensator configured to compensate dispersion caused by the charged-particle separator and a first aperture array disposed between the first deflector array and the charged-particle source and configured to limit probe currents of the plurality of beamlets. In some embodiments, the second lens may be a movable lens disposed on a principal plane normal to the primary optical axis of the primary charged-particle beam. The second lens may comprise a condenser lens. The multi-beam apparatus may further include an aperture plate disposed between the charged-particle source and the second lens and configured to block off a peripheral portion of the primary charged-particle beam and a second aperture array disposed between the aperture plate and the second lens and configured to generate the plurality of beamlets from the primary charged-particle beam. In some embodiments, the first lens may comprise a transfer lens. The transfer lens may be an adjustable lens configured to adjust a magnification of the plurality of beamlets by adjusting a location of the formed image plane and to form the image plane bet ween the first lens and the charged-particle separator.

Some embodiments of the present disclosure may provide a multi-beam apparatus that may include a first deflector array configured to deflect a plurality of beamlets of a primary charged-particle beam wherein the first deflector array is configured to collimate at least one of the plurality of beamlets to be substantially parallel to a primary optical axis of the primary charged-particle beam. The multi-beam apparatus may further include a first lens configured to focus the plurality of beamlets to form a plurality of images of a charged-particle source on an image plane formed closer to the first lens than a charged-particle separator that is configured to separate primary charged particles of the plurality of beamlets and secondary charged particles emitted from a sample, and a second lens configured to project the plurality of images onto the sample and form a plurality of probe spots thereon.

Some embodiments of the present disclosure may provide a method of observing a sample using a multi-beam apparatus. The method may comprise focusing a plurality of beamlets, using a first lens, to form a plurality of images of a charged-particle source on an image plane formed closer to the first lens than a charged-particle separator that is configured to separate primary charged particles of the plurality of beamlets and secondary charged particles emitted front a sample; and projecting the plurality of images, using an objective lens, onto the sample and form a plurality of probe spots thereon.

Exemplary advantages and effects of the present invention will become apparent from the following description taken in conjunction with the accompanying drawings wherein certain embodiments of the present disclosure are set forth by way of illustration and example.

DETAILED DESCRIPTION

Figure 1:
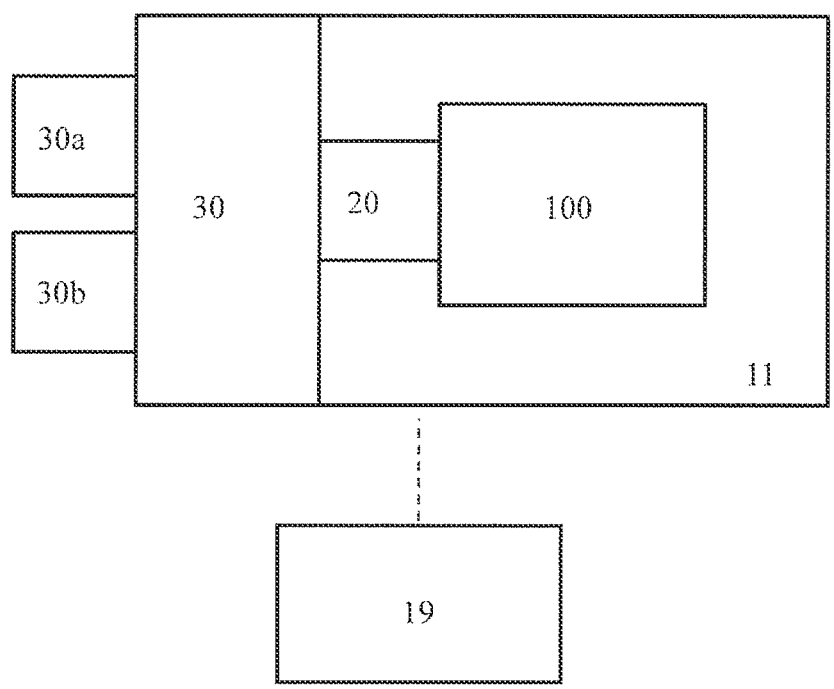
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of systems, apparatuses, and methods consistent with aspects related to the invention as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc. Relative dimensions of components in drawings may be exaggerated for clarity.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a SEM. An SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

In some inspection tools, a primary beam generated from a charged particle source may travel along an optical axis, strike a sample, and a secondary beam may be generated from the sample along the optical axis. A beam separator may be provided on the optical axis to divert the secondary beam to a detector. Thus, the primary beam may initially pass through the beam separator before reaching the sample. One of several problems that may be encountered is that the primary beam may experience dispersion when travelling through the beam separator so that a resulting beam spot on the sample may deviate from the desired shape, such as by increasing in size. This may deteriorate imaging resolution. In some embodiments of the disclosure, the effect of such dispersion may be reduced or eliminated. For example, a transfer lens may be provided that is configured to form an image of the source on an image plane near the beam separator. According to some embodiments, the beam may pass through the beam separator without degrading the quality of the ultimate image of the source on the sample, such as by increasing the size of the probe spot formed on the sample. Thus, imaging resolution may be improved.

In addition to reducing beam dispersion, a transfer lens may be useful in further improving imaging resolution, for example, by reducing; the magnification of the primary charged-particle beam to generate smaller probe spots on the sample. Although, the formation of an intermediate image plane near the beam separator may reduce beam dispersion, the magnification may not be small enough to achieve high resolution. Contrastingly, formation of the intermediate image plane closer to the transfer lens than the beam separator may reduce the magnification of the primary charged-particle beam but may result in increased beam dispersion. In an effort to enhance the imaging resolution, by forming the image plane closer to the transfer lens than the charged-particle separator, the beam dispersion may worsen, causing a loss of imaging resolution. Therefore, a desirable solution may be to reduce the magnification of the primary charged-particle beam white reducing the beam dispersion, to achieve an overall enhancement in imaging resolution.

In some embodiments of the present disclosure, a multi-beam apparatus may include a lens configured to focus the multiple beamlets to form a plurality of images of a charged-particle source on an intermediate image plane. The intermediate image plane may be formed away from a charged-particle separator, enabling a reduction in magnification of the primary charged-particle beam to generate smaller probe spots. The apparatus may further comprise a charged-particle dispersion compensator for compensating dispersion of the beamlets caused due to formation of the image plane away from the charged-particle separator. Some embodiments of the disclosure may enable reduction of magnification of the primary beam while reducing beam dispersion, to enhance overall imaging resolution.

Without limiting the scope of the present disclosure, descriptions and drawings of embodiments may be exemplarily referred to as using an electron beam. However, the embodiments are not used to limit the present invention to specific charged particles. For example, systems and methods for beam forming may be applied to photons, x-rays, and ions, etc. Furthermore, the term "beam" may refer to primary electron beams, primary electron beamlets, secondary electron beams, or secondary electron beamlets, among others.

As used herein, unless specifically stated otherwise, the term "or" encompasses all possible combination, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which illustrates an exemplary electron beam inspection (FBI) system 10, consistent with embodiments of the present disclosure. As shown in FIG. 1, EBI system 10 includes a main chamber 11, a load/dock chamber 20, an electron beam tool 100, and an equipment front end module (EFEM) 30. Electron beam tool 100 is located within main chamber 11.

EFEM 30 includes a first loading port 30a and a second loading port 30b. EFEM 30 may include additional loading port(s). First loading port 30a and second loading port 30b may, for example, receive wafer front opening unified pods (FOUPs) that contain wafers semiconductor wafers or wafers made of other material(s)) or samples to be inspected (wafers and samples may be collectively referred to as "wafers" hereafter). One or more robotic arms (not shown) in EFEM 30 may transport the wafers to load/lock chamber 20.

Load/lock chamber 20 is connected to a lard/lock vacuum pump system (not shown) that removes gas molecules in load/lock chamber 20 to reach a first pressure below the atmospheric pressure. After reaching the first pressure, one or more robotic arms (not shown) may transport the wafer from load/lock chamber 20 to main chamber 11. Main chamber 11 is connected to a main chamber vacuum pump system (not shown), which removes gas molecules in main chamber 11 to reach a second pressure below the first pressure. After reaching the second pressure, the wafer is subject to inspection by electron beam tool 100. Electron beam tool 100 may be a single-beam system or a multi-beam system. A controller 19 is electronically connected to electron beam tool 100. While controller 19 is shown in FIG. 1 as being outside of the structure that includes main chamber 11, load/lock chamber 20, and EFEM 30, it is appreciated that controller 19 may be part of the structure.

While the present disclosure provides examples of main chamber 11 housing an electron beam inspection system, it should be noted that aspects of the disclosure in their broadest sense, are not limited to a chamber housing an electron beam inspection system. Rather, it is appreciated that the principles discussed herein may also be applied to other tools that operate under the second pressure.

Figure 2A:
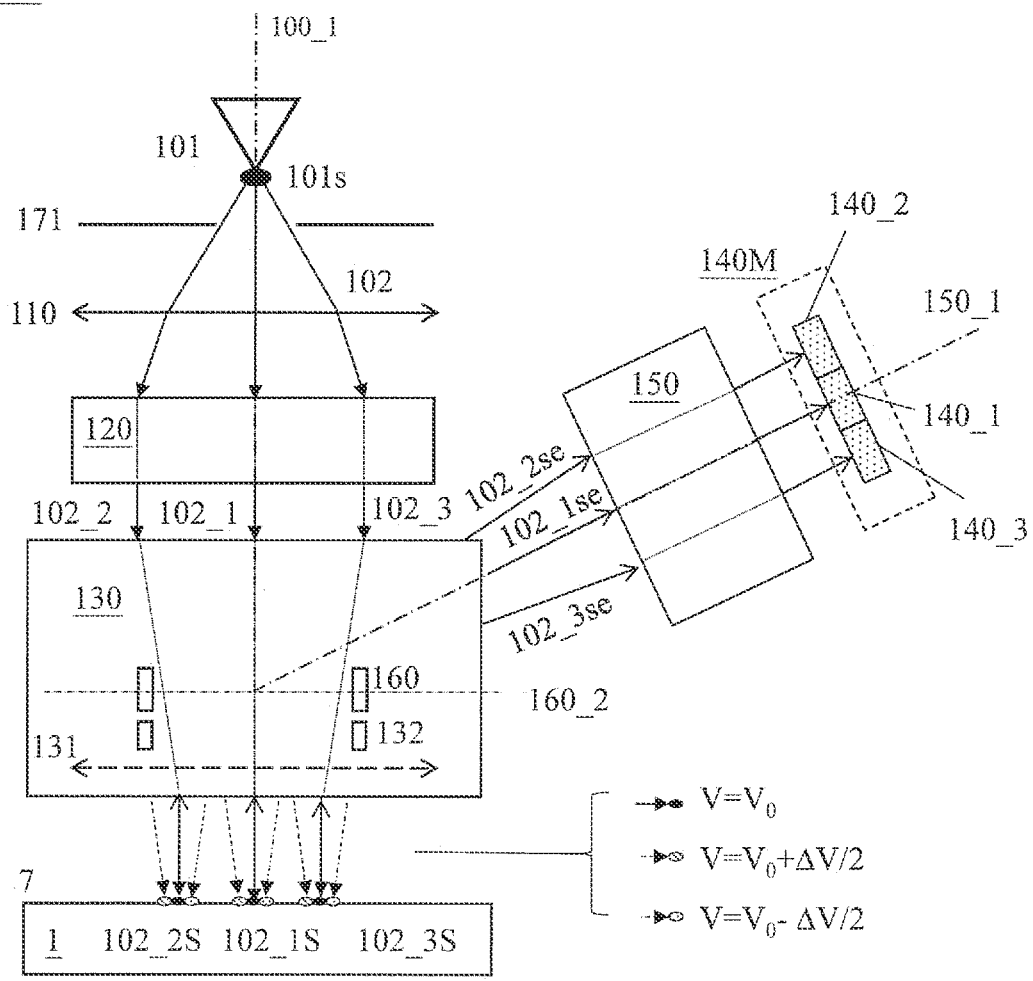
FIG. 2A illustrates an exemplary electron beam tool that may be part of the exemplary electron beam inspection system of FIG. 1.

FIG. 2A illustrates an exemplary electron beam tool 100A that may be part of the EBI system of FIG. 1. An electron beam tool 100A (also referred to herein as "apparatus 100A") comprises an electron source 101, a gun aperture plate 171, a condenser lens 110, a source conversion unit 120, a primary projection optical system 130, a secondary imaging system 150, and an electron detection device 140M. Primary projection optical system 130 may comprise an objective lens 131. A sample 1 with sample surface 7 may be provided on a movable stage (not shown). Electron detection device 140M may comprise a plurality of detection elements 140_1, 140_2, and 140_3. A beam separator 160 and a deflection scanning unit 132 may be placed inside primary projection optical system 130.

Electron source 101, gun aperture plate 171, condenser lens 110, source conversion unit 120, beam separator 160, deflection scanning unit 132, and primary projection optical system 130 may be aligned with a primary optical axis 100_1 of apparatus 100A. Secondary imaging system 150 and electron detection device 140M may be aligned with a secondary optical axis 150_1 of apparatus 100A.

Electron source 101 may comprise a cathode (not shown) and an extractor or anode (not shown), in which, during operation, electron source 101 is configured to emit primary electrons from the cathode and the primary electrons are extracted or accelerated by the extractor or the anode to form a primary electron beam 102 that forms a primary beam crossover (virtual or real) 101s. Primary electron beam 102 may be visualized as being emitted from primary beam crossover 101s.

Source conversion unit 120 may comprise an image-forming element array (not shown in FIG. 2A) and a beam-limit aperture array (not shown in FIG. 2A). The image-forming element array may comprise a plurality of micro-deflectors or micro-lenses that may influence a plurality of primary beamlets 102_1, 102_2, 102_3 of primary electron beam 102 and form a plurality of parallel images (virtual or real) of primary beam crossover 101s, one for each of the primary beamlets 102_1, 201_2, 102_3. The beam-limit aperture array may be configured to limit diameters of individual primary beamlets 102_1, 102_2, and 102_3. FIG. 2A shows three primary beamlets 102_1, 102_2, and 102_3 as an example, and it is appreciated that source conversion unit 120 may be configured to form any number of primary beamlets. For example, source conversion unit 120 may be configured to form a 3×3 array of primary beamlets. Source conversion unit 120 may further compose an aberration compensator array configured to compensate aberrations of probe spots, 102_1S, 102_2S, and 102_3S. In some embodiments, the aberration compensator array may include a field curvature compensator array with micro-lenses that are configured to compensate field curvature aberrations of probe spots, 102_1S, 102_2S, and 102_3S, respectively. In some embodiments, the aberration compensator array may include an astigmatism compensator array with micro-stigmators that are configured to compensate astigmatism aberrations of probe spots, 102_1S, 102_2S, and 102_3S, respectively. In some embodiments, the it element array, the field curvature compensator array, and the astigmatism compensator array may comprise multiple layers of micro-deflectors, micro-lenses, and micro-stigmators, respectively. Examples of a multi-layer array are further described in U.S. Patent Application No. 62/567,134, which is incorporated herein in its entirety.

Condenser lens 110 is configured to focus primary electron beam 102. Condenser lens may further be configured to adjust electric currents of primary beamlets 102_1, 102_2, and 102_3 downstream of source conversion unit 120 by varying the focusing power of condenser lens 110. Beamlets 102_1, 102_2, and 102_3 may thereby have a focusing status that may be changed by Condenser lens 110. Alternatively, the electric currents may be changed by altering the radial sizes of beam-limit apertures within the beam-limit aperture array corresponding to the individual primary beamlets. Thus, current of a beamlet may be different at different locations along the beamlet's trajectory. Beamlet current may be adjusted so that current of the beamlet on the sample surface (e.g., probe spot current) is set to a desired amount.

Condenser lens 110 may be a movable condenser lens that may be configured so that the position of its first principle plane is movable. The movable condenser lens may be configured to be magnetic, or electrostatic, or electromagnetic (e.g., compound). A movable condenser lens is further described in U.S. Pat. No. 9,922,799 and U.S. Patent Application Pub. No. 2017/0025243, both of which are incorporated herein in their entirety. In some embodiments, the condenser lens may be an anti-rotation lens, which may keep rotation angles of off-axis beamlets unchanged while varying the electric currents of the beamlets. In some embodiments, condenser lens 110 may be a movable anti-rotation condenser lens, which involves an anti-rotation lens with a movable first principal plane. An anti-rotation or movable anti-rotation condenser lens is further described in International Application No. PCT/EP2017/084429, which is incorporated by reference in its entirety.

Objective lens 131 may be configured to focus beamlets 102_1, 102_2, and 102_3 onto sample 1 for inspection and may form, in the current embodiment, three probe spots 102_1S, 102_2S, and 102_3S on surface 7. Gun aperture plate 171, in operation, is configured to block off peripheral electrons of primary electron beam 102 to reduce Coulomb effect. The Coulomb effect may enlarge the size of each of probe spots 102_1S, 102_2S, and 102_3S of primary beamlets 102_1, 102_2, 102_3, and therefore deteriorate inspection resolution.

Beam separator 160 may, for example, be a Wien filter comprising an electrostatic deflector generating an electrostatic dipole field E1 and a magnetic dipole field B1. Beam separator 160 may employ Lorentz force to influence electrons passing therethrough. Beam separator 160 may be activated to generate electrostatic dipole field E1 and magnetic dipole field N. In operation, beam separator 160 may be configured to exert an electrostatic force by electrostatic dipole field E1 on individual electrons of primary beamlets 102_1, 102_2, and 102_3. The electrostatic force may be equal in magnitude but opposite in direction to the magnetic force exerted by magnetic dipole field B1 of beam separator 160 on the individual electrons, Primary beamlets 102_1, 102_2, and 102_3 may pass substantially straight through beam separator 160.

Deflection scanning unit 132, in operation, is configured to deflect primary beamlets 102_1, 102_2, and 102_3 to scan probe spots 102_1S, 102_2S, and 102_3S across individual scanning areas in a section of surface 7. In response to illumination of sample 1 by primary beamlets 102_1, 102_2, and 102_3 at probe spots 102_1S, 102_2S, and 102_3S, secondary electrons emerge from sample 1 and form three secondary electron beams 102_1se, 102_2se, and 102_3se, which, in operation, are emitted from sample 1. Each of secondary electron beams 102_1se, 102_2se, and 102_3se typically comprise electrons having different energies including secondary electrons (having electron energy 50 eV) and backscattered electrons (having electron energy between 50 eV and the landing energy of primary beamlets 102_1, 102_2, and 102_3). Beam separator 160 is configured to deflect secondary electron beams 102_1se, 102_2se, and 102_3se toward secondary imaging system 150. Secondary imaging system 150 subsequently focuses secondary electron beams 102_1se, 102_2se, and 102_3se onto detection elements 140_1, 140_2, and 140_3 of electron detection device 140M. Detection elements 140_1, 140_2, and 140_3 are arranged to detect corresponding secondary electron beams 102_1se, 102_2se, and 102_3se and generate corresponding signals that may be sent to signal processing units (not shown) to, for example, construct images of the corresponding scanned areas of sample 1.

As discussed above, beam separator 160 may be a deflection device that includes a magnetic deflector, such as a Wien filter. The deflection device may deflect electrons passing therethrough. The deflection directions and deflection angles of the electrons depend on the movement directions and energies (which may be represented by, e.g., velocities) of the electrons. Thus, primary electrons moving in a direction different than secondary or backscattered electrons may be distinguished from secondary or backscattered electrons. Accordingly, primary beamlets 102_1, 102_2, and 102_3 may be allowed to pass substantially straight through beam separator 160 while secondary electron beams 102_1se, 102_2se and 102_3se are deflected away front optical axis 100_1. However, primary beamlets 102_1, 102_2, and 102_3 themselves may comprise electrons at differing energy levels, Therefore, electrons of primary beamlets 102_1, 102_2, and 102_3 passing through beam separator 160 may not necessarily pass entirely straight through and may instead be deflected with deflection angles. Accordingly, deflection angles of electrons in each beamlet may be different, thereby causing dispersion to be generated in each of primary beamlets 102_1, 102_2, and 102_3. For example, FIG. 2A shows dispersion of each of the primary beamlets with nominal energy $V_0$ and an energy spread $\Delta V$. Each of the primary beamlets may experience dispersion so that a beamlet is dispersed into a beamlet portion corresponding to energy $V_0$, a beamlet portion corresponding to energy $V_0+\Delta V/2$, and a beamlet portion corresponding to energy $V_0-\Delta V/2$.

Dispersion may influence primary beamlets 102_1, 102_2, and 102_3 to form probe spots on sample 1 that deviate from a desired shape, such as by causing probe spots 102_1S, 102_2S, and 102_3S to be enlarged in a direction (e.g., a radial direction in FIG. 2A) related to the dispersion direction. Consequently, dispersion may cause probe spots to be formed, for example, with an oblong shape. Dispersion caused by beam separator 160 may deteriorate imaging resolution.

Furthermore, dispersion may influence secondary electron beams 1102_1se, 102_2se, and 102_3se to form larger spots on electron detection device 140M. Dispersion may deteriorate secondary electron collection efficiency and contribute to cross-talk.

Figure 2B:
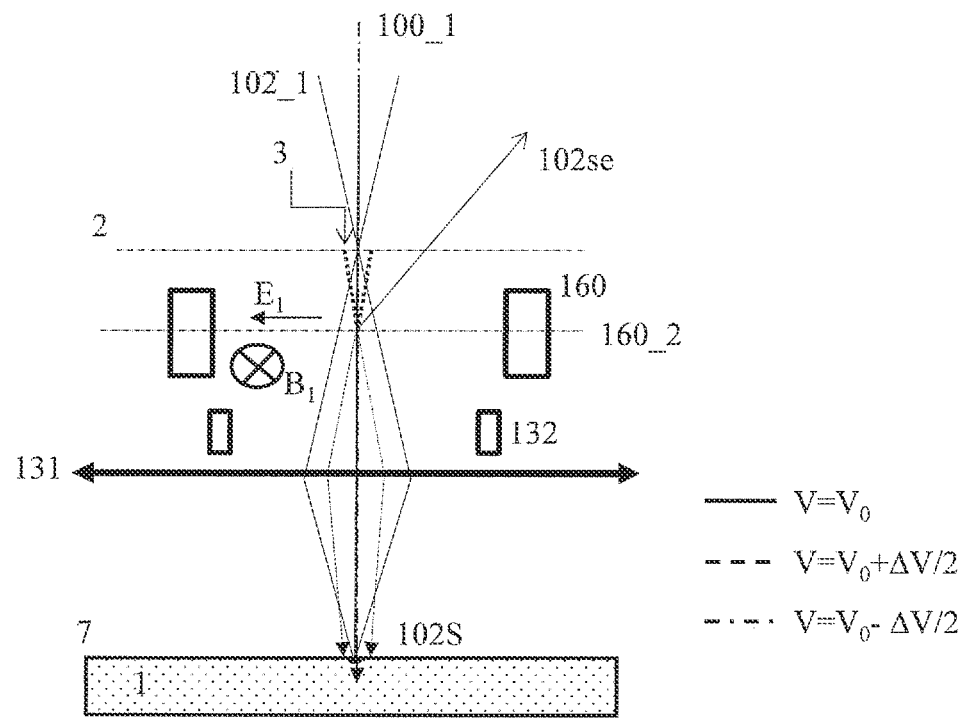
FIG. 2B illustrates an exemplary configuration of a beam separator.

Reference is now made to FIG. 2B, which illustrates an exemplary configuration of a portion of a projection system, consistent with embodiments of the present disclosure. The projection system of FIG. 2B may form a portion of primary projection optical system 130. FIG. 29 shows only a central beamlet 102_1 that is aligned with primary optical axis 100_1. Beamlet 102_1 may be focused onto an intermediate image plane 2. That is, beamlet 102_1 may be formed with a focused spot in image plane 2. Image plane 2 is located above deflection plane 160_2 of beam separator 160. Electrons of beamlet 102_1 traveling along primary optical axis 100_1 having different energies may be dispersed after exiting beam separator 160. Thus, electrons may have a virtual radial shift 3 on image plane 2. That is, electrons may be visualized as being emitted from virtual positions displaced from original positions on image plane 2 by radial shift 3. The radial direction is orthogonal to primary optical axis 100_1. Due to radial shift 3, the focused spot on image plane 2 is visualized as being enlarged. Accordingly, a beam spot 102S formed on sample 1 may be broadened. Furthermore, while FIG. 2B shows only a central beamlet, this effect may even more strongly affect off-axis beamlets. Off-axis beamlets may pass through the beam separator at an angle, and therefore may travel a greater distance through the beam separator and experience more influence of the magnetic and electric fields, thus amplifying dispersion.

Figure 2C:
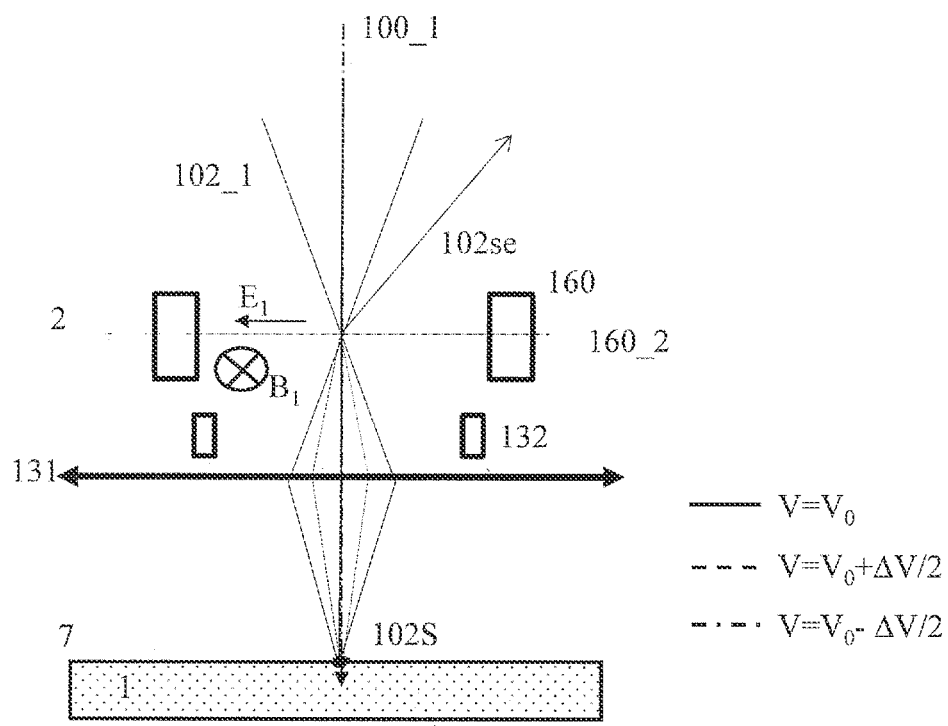
FIG. 2C illustrates an exemplary configuration of a beam separator.

Radial shift 3 may be reduced as image plane 2 approaches deflection plane 160_2. Radial shift 3 may become zero or close to or substantially zero if image plane 2 coincides with deflection plane 160_2, as shown in FIG. 2C. Accordingly, beamlet spot 102S may be formed the same or nearly the same compared to when beam separator 160 is not present or is not activated.

Beam separator 160 may be represented as having a deflection plane 160_2 at its center, but it is understood that deflection may occur on electrons at locations other than directly at deflection plane 160_2. For example, a Wein filter may comprise electrodes and magnetic pole pieces arranged extending parallel to primary optical axis 100_1 over some distance so that electric and magnetic fields are generated over an area. Thus, electrons may begin experiencing deflection upon reaching the beginning of electric and magnetic fields and may continue to experience deflection until exiting the fields. In some embodiments, deflection caused by a beam separator may be approximated by a defection plane which may be located at a center plane of the beam separator. The deflection plane may intersect the beam separator at a location corresponding to a center of distribution of electric or magnetic field. In some embodiments, the deflection plane may be located at the geometric center of the structure forming the beam separator.

Beamlet 102_1, as shown in FIG. 2B and FIG. 2C, may be formed so that it produces an image in image plane 2 by, for example, providing a lens above beam separator 160. A lens or an array of lenses may be provided to focus primary beams or beamlets.

Figure 3:
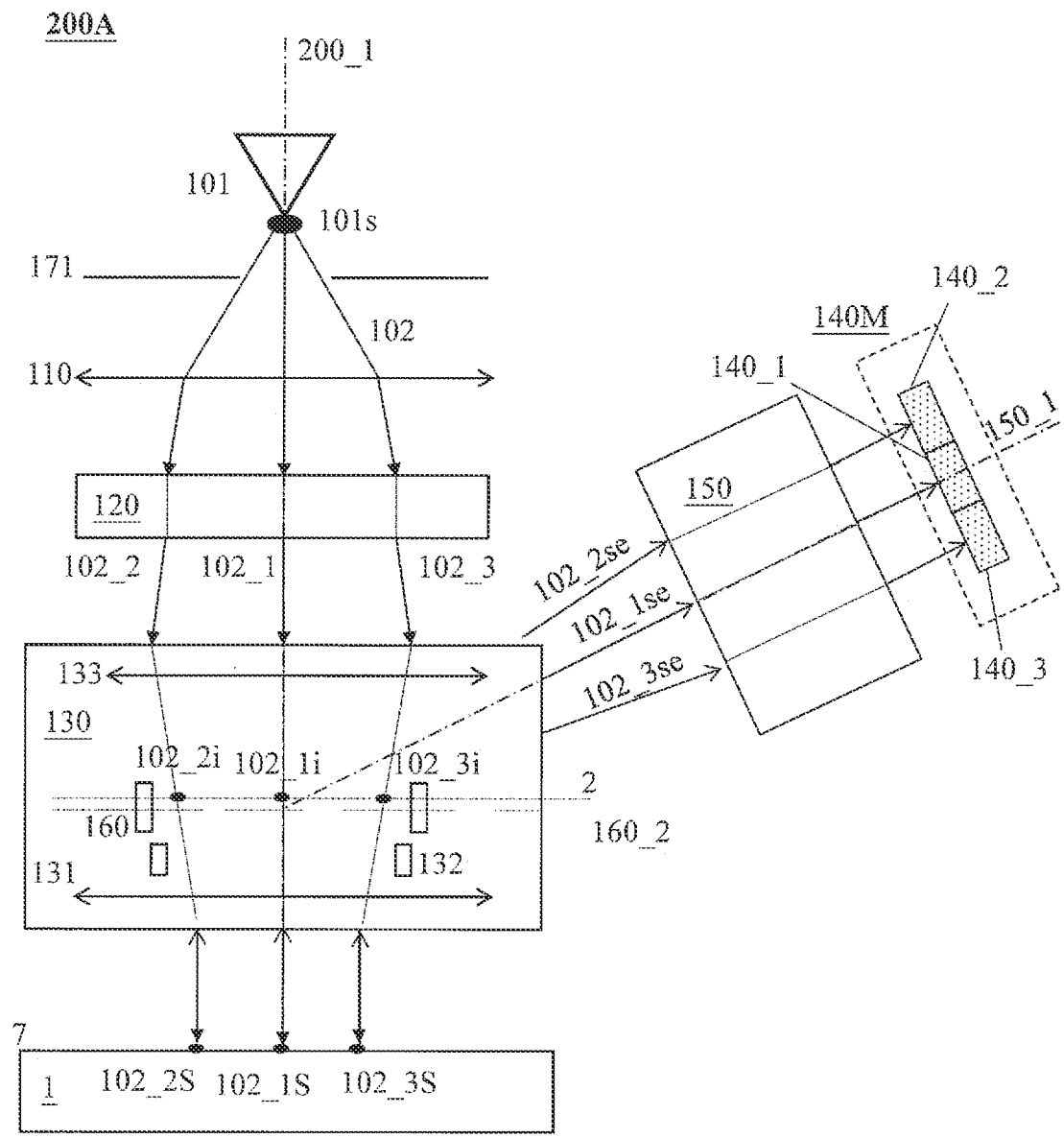
FIG. 3 is a diagram illustrating an exemplary electron beam inspection tool consistent with embodiments of the present disclosure.

FIG. 3 illustrates an apparatus 200A that may be useful for reducing dispersion, consistent with embodiments of the present disclosure. Apparatus 200A may be used as electron beam tool 100 of FIG. 1. As shown in FIG. 3, electron source 101, the main opening of gun aperture plate 171, condenser lens 110, source conversion unit 120, and objective lens 131 are aligned with a primary optical axis 200_1 of the apparatus. Electron source 101 generates a primary electron beam 102 along primary optical axis 200_1 and with a source crossover (virtual or real) 101s.

Condenser lens 110 may focus the primary electron beam 102 to reduce divergence or to become a parallel beam along primary optical axis 200_4. That is, in some embodiments, condenser lens 110 may focus primary electron beam 102 as a parallel beam. Condenser lens 110 may be configured to form primary electron beam 102 to be perpendicularly incident onto source conversion unit 120. An example of source conversion unit 120 may be found in U.S. Pat. No. 9,691,586 U.S. Patent Application Pub. No. 2017/0025243; and International Application No. PCT/EP2017/084429, all of which are incorporated by reference in their entireties.

In source conversion unit 120, deflectors may be provided so that the three beamlets 102_1, 102_2 and 102_3 of the primary-electron beam 102 are respectively deflected. Thus, the deflected beamlets may form virtual images of primary beam crossover 101s. Beamlets 102_1, 102_2 and 102_3 may be deflected, e.g., towards, or outwards, or rotating around primary optical axis 200_1.

Primary projection system 130 includes a transfer lens 133 and objective lens 131. Transfer lens 133 is aligned with primary optical axis 200_1 and, in some embodiments, may be a stationary lens and, in other embodiments, may be a movable lens. Transfer lens 133 is positioned between source conversion unit 120 and beam separator 160. Transfer lens 133 projects the virtual images of primary beam crossover 101s onto image plane 2. Image plane 2 may be an intermediate real image plane. Transfer lens 133 may focus beamlets 102_1, 102_2, and 102_3 to form a plurality of intermediate real images 102_1i, 102_2i, and 102_3i of primary beam crossover 101s on image plane 2. For example, transfer lens 133 may be configured to focus each of the beams passing therethrough so that focused spots are formed on image plane 2.

Image plane 2 may be in a region of beam separator 160. Transfer lens 133 and beam separator 160 may be arranged or adjusted so that image plane 2 is located appropriately. For example, beam separator 160 may be arranged so that its deflection plane 160_2 is close to or coincides with image plane 2. Transfer lens 133 may be arranged and its focusing power set so that image plane 2 is close to or coincides with deflection plane 160_2. Transfer lens 133 may also be configured so that image plane 2 is a specified distance away from transfer lens 133. Transfer lens 133 may be configured so that image plane 2 perpendicularly intersects beam separator 160 at its center, for example at a central point of beam separator 160 along primary optical axis 200_1.

Transfer lens 133 may, for example, be an electrostatic, magnetic, or electromagnetic compound lens. Magnetic or electrostatic fields generated by the lens may be varied by adjusting the electric excitation of the lens, e.g., to change a focusing power of the lens. Thus, a lens may be configured to form an image plane a specified distance away from the lens by adjusting the excitation.

In FIG. 3, the path of beamlets within primary projection optical system 130 may merely be schematic. For example, representation of beamlets between objective lens 131 and transfer lens 133 in dotted lines, as shown in FIG. 3, may indicate a corresponding relationship between beamlets entering and exiting optical elements, such as primary projection optical system 130. That is, the trajectory of beamlets may be different from that shown within primary projection optical system 130 in FIG. 3. Relative positions of beamlets may change with configuration and operation modes of optical elements.

Transfer lens 133 and objective lens 131 of primary projection optical system 130 may be configured to cooperate to form beam spots on sample 1. Objective lens 131 focuses the three deflected beamlets onto surface 7 of sample 1, and accordingly generates three images, 102_1S, 102_2S and 102_3S of primary beam crossover 101s thereon to act as probe spots. Secondary electron beams 102_1se, 102_2se, and 102_3se may be emitted from sample 1 from probe spots 102_1S, 102_2S, and 102_3S. Beam separator 160 directs secondary electron beams 102_1se, 102_2se, and 102_3se toward secondary optical system 150.

Figure 4A:
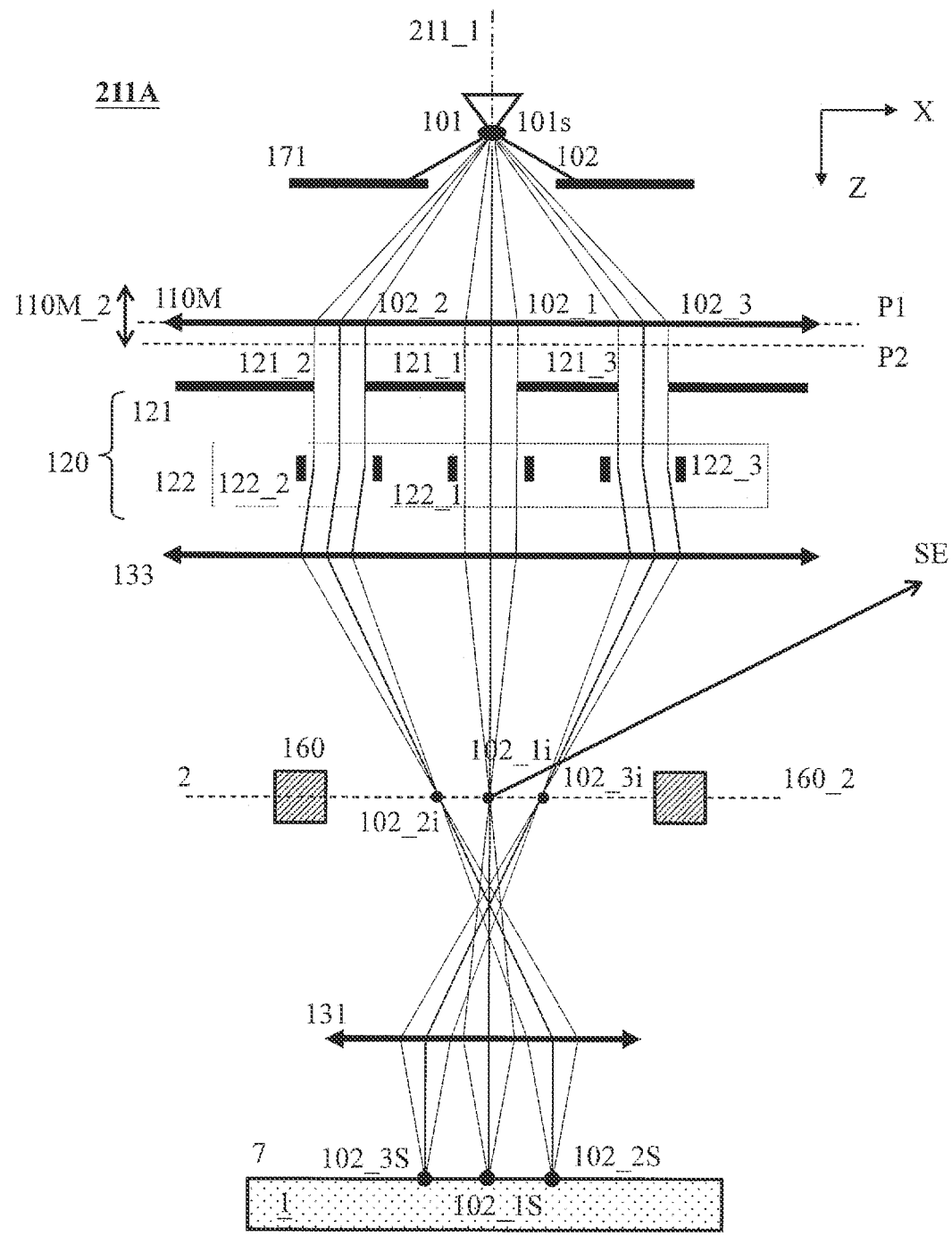
FIGS. 4A, 4B, and 4C illustrate exemplary electron beam inspection tools consistent with embodiments of the present disclosure.

Reference is now made to FIG. 4A, which illustrates an exemplary multi-beam apparatus 211A, consistent with embodiments of the present disclosure. In FIG. 4A, an X-axis corresponds to a radial direction and a Z-axis corresponds to a direction along a primary optical axis 211_1 of apparatus 211A. Apparatus 211A may be used as electron beam tool 100 of FIG. 1.

In apparatus 211A primary-electron beam 102 emitted from primary beam crossover 101s of source 101 may be collimated by condenser lens 110M and perpendicularly incident onto source conversion unit 120. Source conversion unit 120 may be provided with a beam-limit aperture array 121 and an image forming element array 122. Beam-limit aperture array 121 may comprise beam-limit apertures 121_1, 121_2, and 121_3. Beam-limit apertures 121_1, 121_2, and 121_3 may limit sizes of beamlets 102_1, 102_2, and 102_3 of primary-electron beam 102. Image-forming element array 122 may comprise image-forming deflectors 122_1, 122_2, and 122_3. Deflectors 122_1, 122_2 and 122_3 may deflect beamlets 102_1, 102_2, and 102_3 to form virtual images of primary beam crossover 101s. In some embodiments, deflectors further away from primary optical axis 211_1 may deflect beamlets to a greater extent. Furthermore, image-forming element array 122 may comprise multiple layers, and deflectors 122_1, 122_2, and 122_3 may be provided in separate layers. Deflectors 122_1, 122_2, and 122_3 may be individually controlled independent from one another. In some embodiments, a deflector may be controlled to adjust a pitch of probe spots formed on sample 1.

Condenser lens 110M may be configured to be movable for adjusting electric currents of beamlets 102_1, 102_2, and 102_3. Movable condenser lens 110M nay have a principal plane 110M_2 at a position P1 and may be moved along primary optical axis 211_1 of the apparatus. For example, principal plane 110M_2 may be moved from position P1 to position P2 further away from electron source 101, and accordingly the currents of beamlets 102_1, 102_2 and 102_3 may be decreased. Principal plane 110M_2 may be moved closer to electron source 101 so that the currents of beamlets 102_1, 102_2 and 102_3 may be increased. Additionally, currents of beamlets 102_1, 102_2 and 102_3 may be changed by changing sizes of beam-limit apertures 121_1, 121_2, and 121_3. Primary-electron beam 102 may be maintained as a parallel beam when varying the currents of the beamlets.

Transfer lens 133 focuses beamlets 102_1, 102_2, and 102_3 to project the virtual images of primary beam crossover 101s onto image plane 2 to form real images 102_1i, 102_2i, and 102_3i of primary beam crossover 101s. Objective lens 131 projects images 102_1i, 102_2i, and 102_3i onto sample 1 to form probe spots 102_1S, 102_2S, and 102_3S on surface 7 of sample 1. Deflectors 122_1, 122_2, and 122_3 may deflect the beamlets so that probe spots 102_1S, 102_2S, and 102_3S are spaced apart from one another by a predetermined amount.

A centrally located deflector of image-forming element array 122 may be aligned with primary optical axis 211_1 of apparatus 211A. Thus, in some embodiments, a central deflector may be configured to maintain the trajectory of beamlet 102_1 to be straight. In some embodiments, the central deflector may be omitted. However, in some embodiments primary electron source 101 may not necessarily be aligned with the center of source conversion unit 120. Furthermore, it is appreciated that while FIG. 4A shows a side view of apparatus 211A where beamlet 102_1 is on primary optical axis 211_1, beamlet 102_1 may be off primary optical axis 211_1 when viewed from a different side. That is, in some embodiments, all of beamlets 102_1, 102_2, and 102_3 may be off-axis. An off-axis component may be offset relative to primary optical axis 211_1.

The deflection angles of the deflected beamlets may be set based on one or more criteria. As shown in FIG. 4A, deflectors 122_2 and 122_3 may deflect off-axis beamlets radially outward or away from primary optical axis 211_1. In some embodiments, deflectors 122_2 and 122_3 may deflect off-axis beamlets radially inward or towards primary optical axis 211_1. Deflection angles of the beamlets may be set so that beamlets 102_1, 102_2, and 102_3 land perpendicularly on sample 1. Off-axis aberrations of images due to lenses, such as objective lens 131, may be reduced by adjusting paths of the beamlets passing through the lenses. Therefore, deflection angles of off-axis beamlets 102_2 and 102_3 generated by deflectors 122_2 and 122_3 may be set so that probe spots 102_2S and 102_3S have small aberrations. Beamlets may be deflected so as to pass through or close to the front focal point of objective lens 131 to decrease aberrations of off-axis probe spots 102_2S and 102_3S. In some embodiments, deflectors may be set to make beamlets 102_1, 102_2, and 102_3 land perpendicularly on sample 1 while probe spots 102_1S, 102_2S, and 102_3S have small aberrations. An arrangement of transfer lens 133 and objective lens 131 may be configured to focus beamlets 102_1, 102_2, and 102_3 while image-forming element array 122 may be configured to deflect beamlets 102_1, 102_2, and 102_3 with deflection angles so that they pass through or close to the front focal point of objective lens 131.

One beamlet may comprise electrons at differing energy levels. Because image plane 2 is at deflection plane 160_2 of beam separator 160, after exiting beam separator 160, electrons at different energy levels are deflected by different angles but radial shift 3 (as in FIG. 2B) on image plane 2 is substantially zero. The deflected electrons may be refocused by objective lens 131 to form a probe spot on sample 1 without dispersion influence.

In response to illumination by primary beamlets 102_1, 102_2, and 102_3 at probe spots 102_1S, 102_2S, and 102_3S, secondary electrons SE emerge from sample 1 and are deflected by beam separator 160 toward a secondary imaging system.

As shown in FIG. 4A, transfer lens 133 may be configured so that image plane 2 is at deflection plane 160_2. However, in some embodiments, image plane 2 need not be at deflection plane 160_2 of beam, separator 160. Image plane 2 may be located above or below deflection plane 160_2. In some embodiments, transfer lens 133 may be configured to ensure sizes of probe spots 102_1S, 102_2S, and 102_3S relatively increase within 20% due to dispersions of beam separator 160 on beamlets 102_1, 102_2, and 102_3.

As shown in FIG. 2B, radial shift 3 increases as the distance between image plane 2 and deflection plane 160_2 increases. Consequently, probe spots 102S increase in size. In some embodiments, the distance between image plane 2 and deflection plane 160_2 is chosen so that sizes of probe spots increase by less than 20% in comparison with non-dispersion sizes (e.g., when beam separator 160 is turned off). When non-dispersion spot size is 10 nm, the sizes of probe spots 102_1S, 102_2S, and 102_3S that are influenced by dispersion may be limited to within, for example, 12 nm. Thus, transfer lens 133 may be configured such that image plane 2 is in a region at or near to beam separator 160. Image plane 2 formed by transfer lens 133 may be located within edges of beam separator 160 in the direction of primary optical axis 211_1 (Z-direction) or may be located beyond beam separator 160.

In some semiconductor fabrication processes, targeting a size increase of beam spots due to dispersion of less than 20% may be adequate for imaging the smallest feature size of patterns to be inspected. For example, with 7 nm node technologies, a probe spot size increase of less than or equal to 20% may be adequate to ensure sufficient resolution to image the smallest objects in a pattern. Other thresholds may be set for other processes appropriately, such as for 14 nm, 10 nm, and 5 nm technologies, among others.

A transfer lens that is configured to form an image of charged particle source 101 on image plane 2 at least near deflection plane 160_2 of beam separator 160 may include transfer lens 133 that is configured to form image plane 2 at deflection plane 160_2 or offset from deflection plane 160_2 of beam separator 160 by a certain amount. The amount of offset of image plane 2 from deflection plane 160_2 may correspond to, for example, such an amount that size increase of beam spots relative to non-dispersion size is limited to 20%.

Figure 4B:
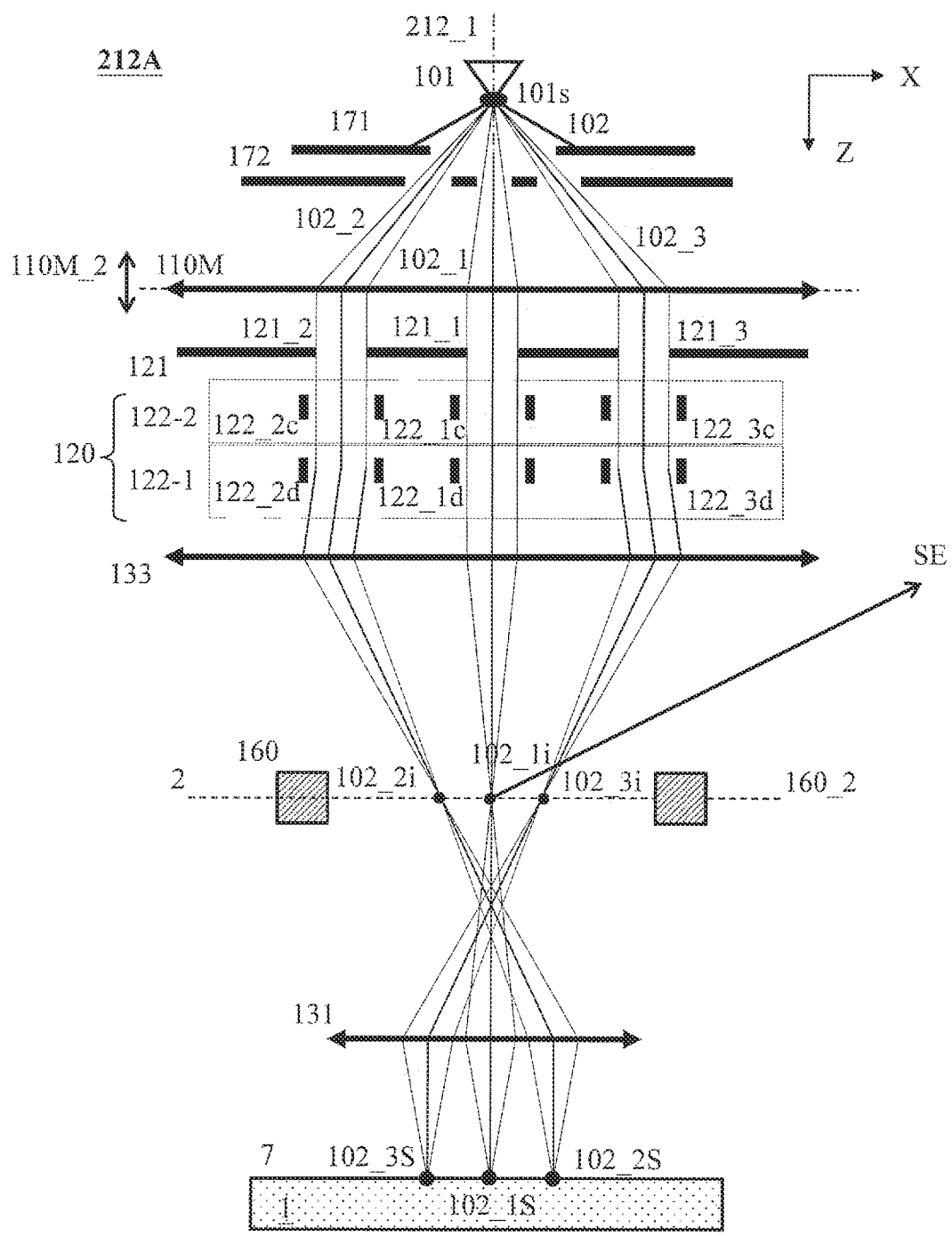

Reference is now made to FIG. 4B, which illustrates an exemplary multi-beam apparatus 212A, consistent with embodiments of the present disclosure. In comparison with the embodiment of apparatus 211A shown in FIG. 4A, apparatus 212A also includes a pre-beamlet-forming mechanism 172, and an aberration-compensator array 122-2. Pre-beamlet-forming mechanism 172 may comprise a Coulomb aperture array. A central aperture of pre-beamlet-forming mechanism 172 and a central deflector of aberration-compensator array 122-2 may be aligned with a primary optical axis 212_1 of apparatus 212A.

Pre-beamlet-forming mechanism 172 may be provided with a plurality of pre-trimming apertures (e.g., a Coulomb aperture array). Pre-beamlet-forming mechanism 172 may be provided above movable condenser lens 110M and close to electron source 101. In FIG. 4B, the three beamlets 102_1, 102_2 and 102_3 respectively pass through the three pre-trimming apertures, and much of the remaining part of primary electron beam 102 is cut off. That is, pre-beamlet-forming mechanism 172 may trim much or most of the electrons from primary electron beam 102 that do not form the three beamlets 102_1, 102_2 and 102_3. Pre-beamlet-forming mechanism 172 may cut off electrons that will ultimately not be used to form probe spots 102_1S, 102_2S and 102_3S before primary electron beam 102 enters source conversion unit 120. In this way, the Coulomb effect above beam-limit aperture array 121 may be reduced to a great degree. Gun aperture plate 171 may be provided close to electron source 101 to cut off electrons at an early stage, while pre-beamlet-forming mechanism 172 may also be provided to further cut off electrons around a plurality of beamlets.

When pre-beamlet-forming mechanism 172 is placed in close proximity to source 101, the sizes of the pre-trimming apertures required to achieve the desired beamlet size or shape may be too small to be manufactured. In such a case, pre-beamlet-forming mechanism 172 may be placed a distance away from source 110 that facilitates manufacturable size or sizes of the pre-trimming apertures, and gun aperture plate 171 may be used and located above pre-beamlet-forming mechanism 172 to cut off electrons at an early stage to reduce Coulomb effect. To more effectively cut off electrons that will not be part of the beamlets, sizes of pre-trimming apertures are chosen to facilitate setting, desired currents of probe spots 102_1S, 102_2S, and 102_3S. Smaller sizes are used for smaller currents, and larger sizes are used for larger currents. Pre-beamlet-forming mechanism 172 may be movable in a direction perpendicular to primary optical axis 212_1 so that pre-trimming apertures with desired sizes may be moved in to cut primary electron beam 102 to obtain the desired current(s). For example, a motor may be coupled with pre-beamlet-forming mechanism 172 and configured to move pre-beamlet-forming mechanism 172 in the X-Y plane (where the Y-axis is in/out of the plane of the page of FIG. 4B). In such a case where gun aperture plate 171 and pre-beamlet-forming mechanism 172 are both provided, gun aperture plate 171 above pre-beamlet-forming mechanism 172 may keep source 101 stable in electron emission when pre-beamlet-forming mechanism 172 is moving.

In some embodiments, pre-beamlet-forming mechanism 172 may be placed below movable condenser lens 110M. Placing pre-beamlet-forming mechanism 172 closer to electron source 101 may more effectively reduce the Coulomb effect. In some embodiments, gun aperture plate 171 may be omitted when pre-beamlet-forming mechanism 172 is able to be located sufficiently close to source 101 while still being manufacturable.

Image plane 2 is an object plane of objective lens 131, and characteristics of objective lens 131 may remain constant. That is, in some embodiments, characteristics of objective lens 131 need not be changed when currents of beamlets 102_1, 102_2, and 102_3 (and hence, probe spots 102_1S, 107_2S, and 102_3S) are changed. For example, objective lens excitation may be fixed when varying the currents of beamlets 102_1, 102_2, and 102_3.

Source conversion unit 120 may be provided with image-forming element array 122-1 and aberration-compensator array 122-2. Image-forming element array 122-1 of apparatus 212A may be the same as beam-limit array 122 of apparatus 211A as shown in FIG. 4A. Image-forming element array 122-1 may comprise an array of image-forming micro-deflectors 122_1d, 122_2d, and 122_3d that may be set so that beamlets 102_1, 102_2, and 102_3 land on sample 1 perpendicularly or so that probe spots 102_1S, 102_2S and 102_3S have small aberrations. Aberration-compensator array 122-2 may comprise an array of aberration compensators 122_1c, 122_2c, and 122_3c that that are configured to compensate for aberrations. For example, aberration-compensator array 122-2 may compensate for field curvature aberration or astigmatism aberration of probe spots 102_1S, 102_2S and 102_3S. Image-forming micro-deflectors of source conversion unit 120 may be configured to deflect beamlets outwards, or inwards or even rotating around primary optical axis 212_1.

Figure 4C:
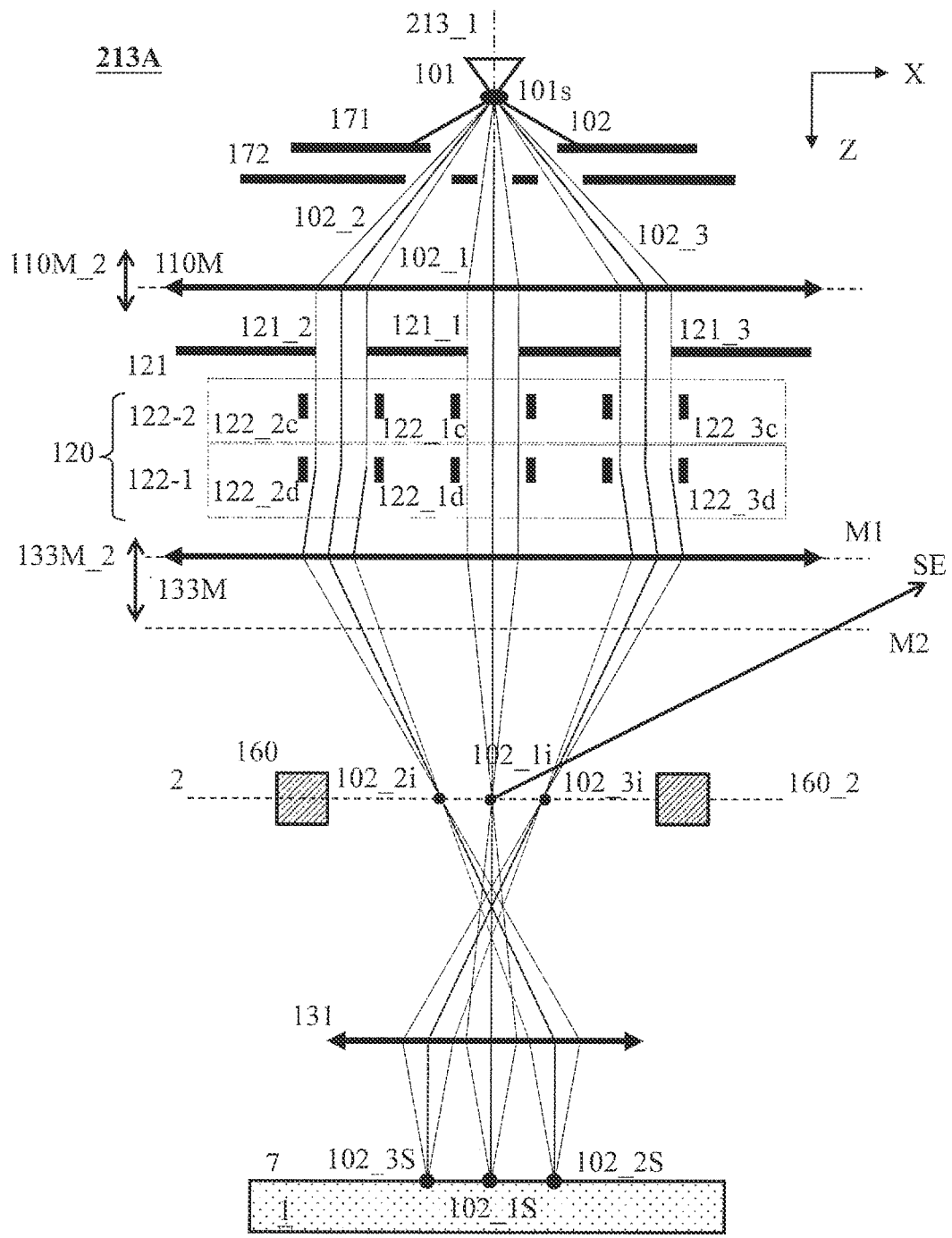

Reference is now made to FIG. 4C, which illustrates an exemplary multi-beam apparatus 213A, consistent with embodiments of the present disclosure. In comparison with the embodiment of apparatus 212A shown in FIG. 4B, apparatus 213A includes a movable transfer lens 133M that may replace, for example, transfer lens 133 in the embodiment of apparatus 212A. Movable transfer lens 133M may be aligned with a primary optical axis 213_1 of apparatus 213A.

Movable transfer lens 133M may have a principal plane 133M_2 at a position M1 and may be moved along primary optical axis 213_1 of the apparatus. For example, principal plane 133M_2 may be moved from position M1 to a position M2 further away from source conversion unit 120. Adjusting the position of movable transfer lens 133M may affect the position of images 102_1i, 102_2i, and 102_3i formed in image plane 2, thus changing the pitch(es) of probe spots 102_1S, 102_2S, and 102_3S on sample 1. Pitches of probe spots 102_1S, 102_2S, and 102_3S increase when principal plane 133M_2 is moved further away from source conversion unit 120. Image-forming micro-deflectors 122_1d, 122_2d, and 122_3d may deflect beamlets 102_1, 102_2, and 102_3 to cause the beamlets to land on sample 1 perpendicularly or with small aberrations.

In some embodiments, pitches of probe spots 102_1S, 102_2S, and 102_3S may be the same or may be different from one another. When pitches are changed by adjusting a lens, and all beamlets pass through that lens, the pitches may be controlled together. For example, when moving a principal plane of a lens, such as principal plane 133M_2, or when moving image plane 2, pitches of probe spots 102_1S, 102_2S, and 102_3S may be controlled together.

Figure 4D:
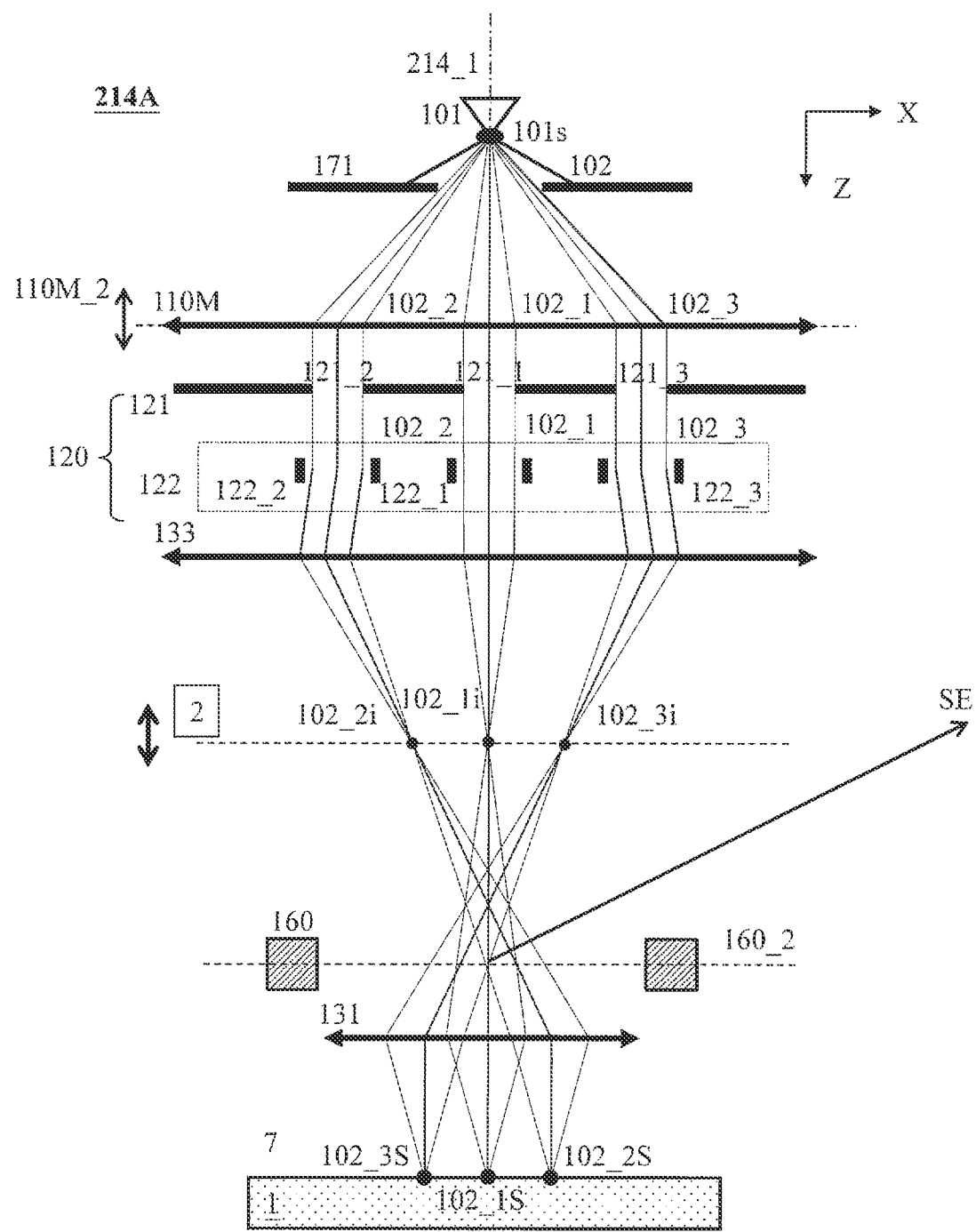
FIGS. 4D, 4E, 4F, and 4G illustrate exemplary electron beam inspection tools consistent with embodiments of the present disclosure.

Reference is now made to FIG. 4D, which illustrates an exemplary multi-beam apparatus 214A, consistent with embodiments of the present disclosure. In FIG. 4D, an X-axis corresponds to a radial direction and a Z-axis corresponds to a direction along a primary optical axis 214_1 of multi-beam apparatus 214A. Multi-beam apparatus 214A may be used as electron beam tool 100 of FIG. 1.

In apparatus 214A, primary-electron beam 102 emitted from primary beam crossover 101s of electron source 101 may be collimated by condenser lens 110M to be perpendicularly incident onto source conversion unit 120. Source conversion unit 120 may be provided with a beam-limit aperture array 121 and an image-forming element array 122. Beam-limit aperture array 121 may comprise beam-limit apertures 121_1, 121_2, and 121_3. Beam-limit apertures 121_1, 121_2, and 121_3 may be configured to limit sizes of beamlets 102_1, 102_2, and 102_3 of primary-electron beam 102. Image-forming element array 122 may comprise image-forming deflectors 122_1, 122_2, and 122_3. Deflectors 122_1, 122_2, and 122_3 may deflect beamlets 102_1, 102_2, and 102_3 to form virtual images of primary beam crossover 101s. In some embodiments, deflectors further away from primary optical axis 211_1 may deflect beamlets to a greater extent. Furthermore, image-forming element array 122 may comprise multiple layers, and deflectors 122_1, 122_2, and 122_3 may be provided in separate layers (not illustrated). Deflectors 122_1, 122_2, and 122_3 may be individually controlled independent from one another. In some embodiments, a deflector may be controlled to adjust a pitch of probe spots formed on sample 1.

As shown in FIG. 4D, multi-beam apparatus 214A may comprise a gun aperture plate 171 configured to trim off peripheral electrons of primary electron beam 102. Because of the divergence of primary electron beam 102, placing gun aperture plate 171 too close to electron source 101 may not effectively reduce the cross-section of primary electron beam 102 incident on condenser lens 110M. In addition, deposition of debris or particles from electron source 101 on gun aperture plate 171 may undesirably reduce the aperture size. Placing gun aperture plate 171 too tar from electron source 101 may result in reduction of beam current by trimming off a larger portion of primary electron beam 102, which is also not desirable. Therefore, gun aperture plate 171 may be placed at an optimal distance away from primary beam crossover 101s of electron source 101.

In combination with beam-limit aperture array 121, condenser lens 110M may be configured to adjust electric currents of beamlets 101_1, 102_2, and 102_3. In some embodiments, adjustable condenser lens 110M may have a principal plane 110M_2, which may be moved along primary optical axis 214_1 of multi-beam apparatus 214A. For example, principal plane 110M_2 may be moved further away from electron source 101 to decrease the electric currents of beamlets 102_1, 102_2 and 102_3, and principal plane 110M_2 may be moved closer to electron source 101 to increase the currents of beamlets 102_1, 102_2 and 102_3. In combination with adjusting the position of principal plane 110M_2, changing the size of the apertures of beam-limit aperture array 121 may change the currents of beamlets 102_1, 102_2 and 102_3. The current of the beamlets may change after the beamlets pass through apertures of beam-limit aperture array 121. Primary-electron beam 102 may be maintained as a parallel beam when varying the currents of the beamlets.

Transfer lens 133 may be configured to focus beamlets 102_1, 102_2, and 102_3 to project the virtual images of primary beam crossover 101s onto intermediate image plane 2 to form real images 102_1i, 102_2i, and 102_3i of primary beam crossover 101s. As shown in FIG. 4D, transfer lens 133 may be configured so that intermediate image plane 2 is formed closer to transfer lens 133 than deflection plane 160_2 of beam separator 160. The position of intermediate image plane 2 may be adjusted along primary optical axis 214_1 to adjust the magnification of primary electron beam 102 or primary beam crossover 101s. In the context of this disclosure, "closer" refers to physical proximity of objects, whether real or virtual. For example, if image plane 2 is closer to transfer lens 133 than beam separator 160, it means that the vertical distance along primary optical axis 214_1 from image plane 2 to transfer lens 133 is smaller than the vertical distance from image plane 2 to beam separator 160. The vertical distance between image plane 2 and transfer lens 133 may be measured as the distance along primary optical axis 214_1 between image plane 2 and the center axis of transfer lens 133. The vertical distance between image plane 2 and beam separator 160 may be measured as the distance along primary optical axis 214_1 between image plane 2 and deflection plane 160_2 of beam separator 160.

In some embodiments, a small magnification of primary beam crossover 101s may be desirable. For example, smaller probe spots (e.g., 102_1S, 102_2S, and 102_3S) generated from primary beam crossover 101s may result in enhanced image resolution. Magnification may be determined based on a ratio of the size of the probe spots to the size of primary beam crossover 101s.

In some embodiments, magnification may be referred to as a ratio of the focal length of objective lens 131 to the focal length of condenser lens 110M. A short focal length of objective lens 131 and a long focal length of condenser lens 110M may be needed to obtain small magnification such that the probe spots are smaller, resulting in enhanced resolution.

In multi-beam apparatus 214A, magnification may be determined based on a ratio of the distance between objective lens 131 and sample 1 to the distance between intermediate image plane 2 and objective lens 131. Increasing the distance between intermediate image plane 2 and objective lens 131 may further reduce the magnification of primary beam crossover 101s.

Transfer lens 133 may, for example, be an electrostatic, magnetic, or electromagnetic compound lens. Focal length or focusing power of transfer lens 133 may be adjusted by changing the electric excitation of the lens or by changing the physical position of transfer lens 133 (not illustrated in FIG. 4D), or both. Thus, transfer lens 133 may be configured to form image plane 2 a specified distance away from the leaps, as illustrated in FIG. 4D, to vary the magnification, as appropriately needed.

Multi-beam apparatus 214A may comprise beam separator 160 to separate the primary charged-particles incident of sample 1 from secondary or backscattered electrons emitted from sample 1 upon interaction with primary charged-particles. In some embodiments, beam separator may be placed between objective lens 131 and transfer lens 133 such that beam separator 160 is closer to objective lens 131 to allow adequate space for secondary imaging system 150 to be placed.

Figure 4E:
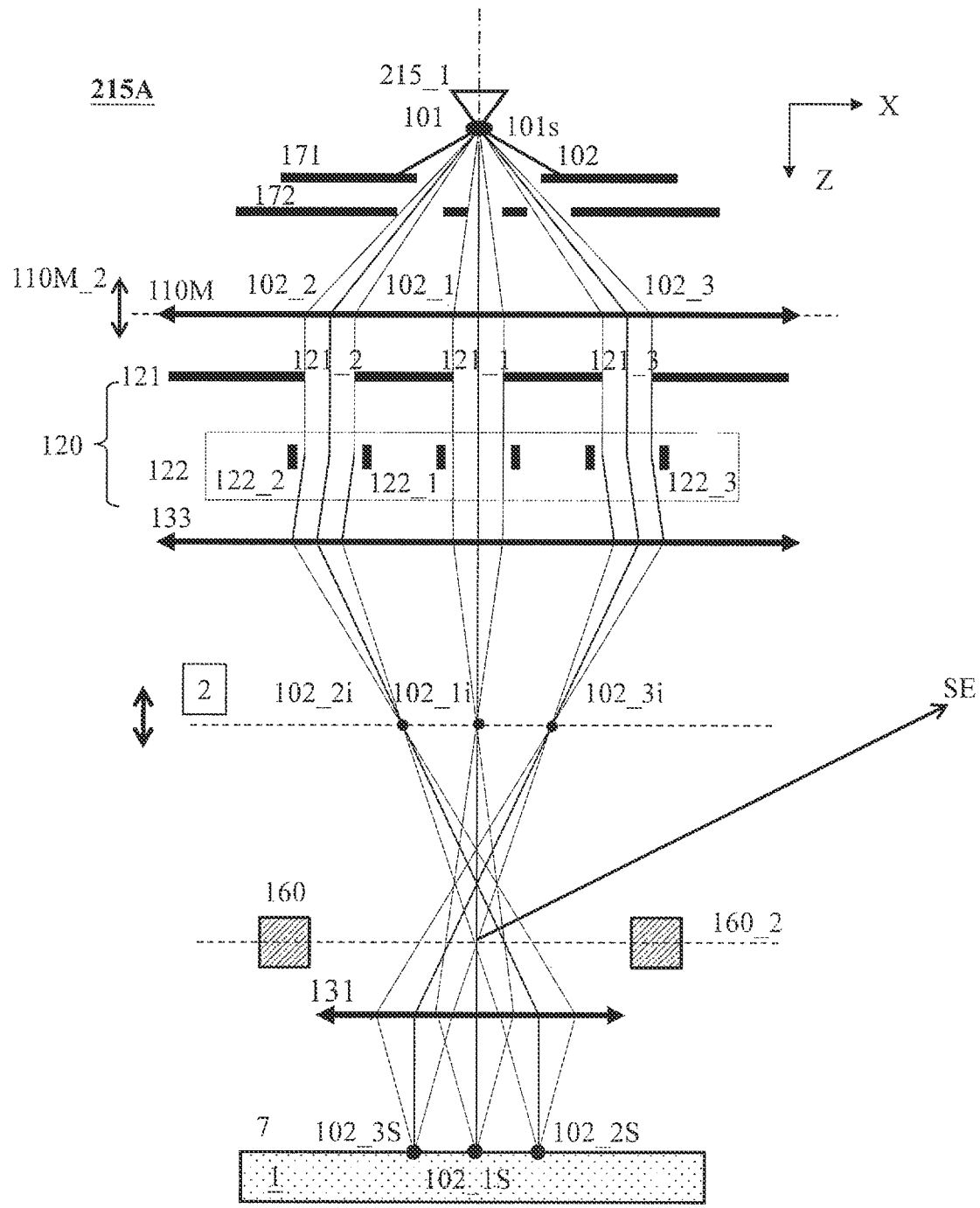

Reference is now made to FIG. 4E, which illustrates an exemplary multi-beam apparatus 215A, consistent with embodiments of the present disclosure. In comparison with embodiment of multi-beam apparatus 214A shown in FIG. 4D, multi-beam apparatus 215A includes pre-beamlet-forming mechanism 172. Pre-beamlet-forming mechanism 172 may comprise a Coulomb aperture array.

In some embodiments, pre-beamlet-forming mechanism 172 may be provided with a plurality of pre-trimming apertures (e.g., a Coulomb aperture array). Pre-beamlet-forming mechanism 172 may be provided above movable condenser lens 110M and close to electron source 101. In FIG. 4E, primary electron beam 102 passes through the three pre-trimming apertures, and much of the remaining part of primary electron beam 102 is trimmed off. That is, pre-beamlet-forming mechanism 172 may trim much or most of the electrons from primary electron beam 102 that do not form the three beamlets 102_1, 102_2 and 102_3 to reduce the Coulomb effect above beam-limit aperture array 121. The shapes and sizes of the plurality of pre-trimming apertures may be adjusted to maximize the reduction of Coulomb effect.

In some embodiments, gun aperture plate 171 may be provided close to electron source 101 to cut off electrons at an early stage, while pre-beamlet-forming mechanism 172 may also be provided to further cut off electrons around a plurality of beamlets. In some embodiments, pre-beamlet-forming mechanism 172 may be used without gun aperture plate 171. This may allow for a simpler column design, lower maintenance costs, or reduced tool down time.

Figure 4F:
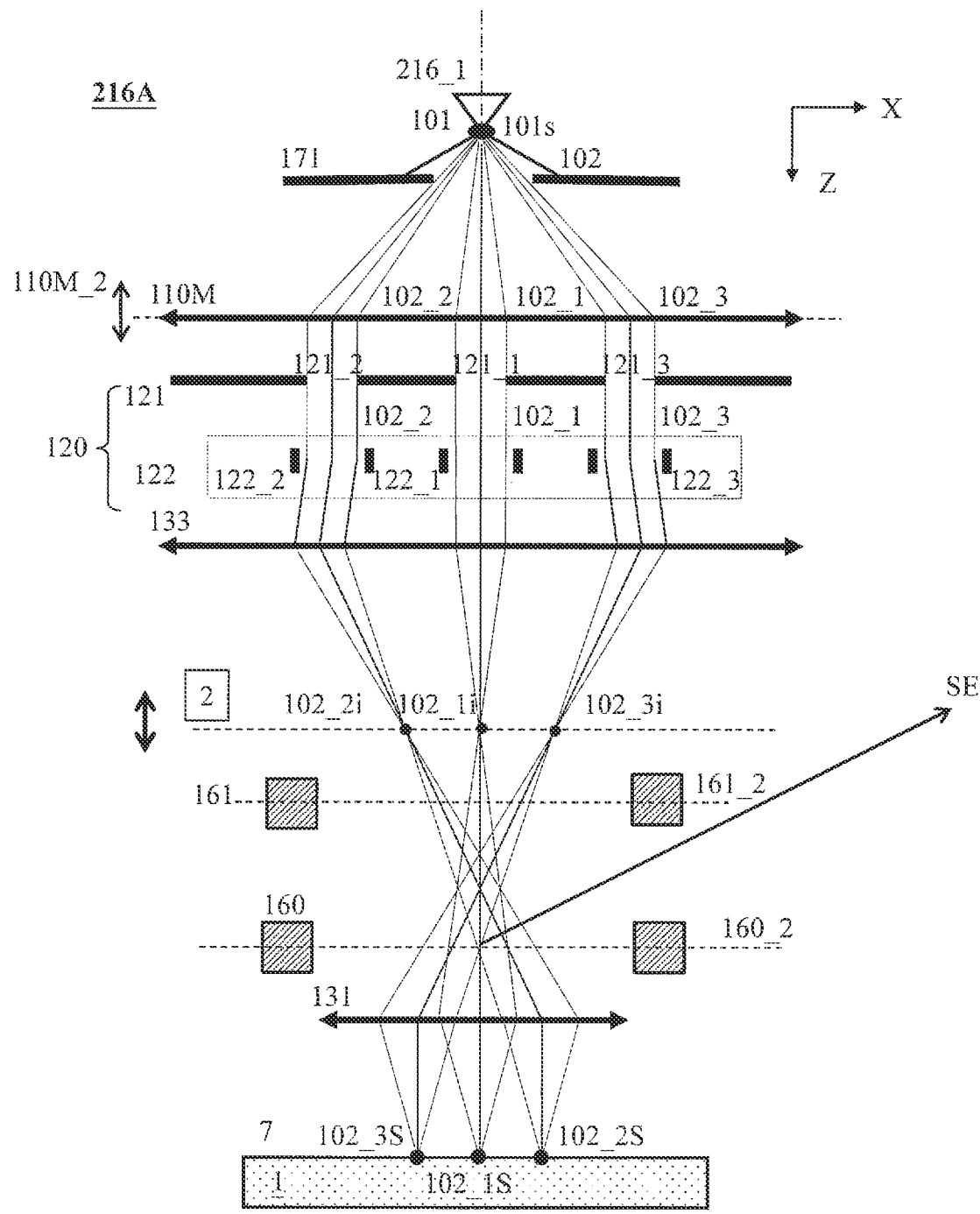

Reference is now made to FIG. 4F, which illustrates an exemplary multi-beam apparatus 216A, consistent with embodiments of the present disclosure. In addition to embodiment of multi-beam apparatus 214A shown in FIG. 4D, multi-beam apparatus 216A includes a beam dispersion compensator 161.

Beam dispersion compensator 161 may be configured to compensate for the dispersion of electron beams caused by beam separator 160 (as discussed earlier in the disclosure). Beam dispersion compensator 161 may be placed between beam separator 160 and transfer lens 133. Beam dispersion compensator 161 may be represented as having a deflection plane 161_2 at its center. Beam dispersion compensator 161 may, for example, comprise a Wien filter. An example of beam dispersion compensator 161 and exemplary methods of compensating beam dispersion may be found in U.S.

Patent Application Pub. No. 2019/0035595, which is incorporated by reference in its entirety.

Multi-beam apparatus 216A may be configured to reduce magnification and compensate for beam dispersion, to enhance imaging resolution. The position of intermediate image plane 2 may be adjusted by changing the electrical excitation of transfer lens 133. The change in position of image plane 2 may vary the magnification. For example, formation of image plane 2 away from beam separator 160 but closer to transfer lens 133 may result in smaller magnification. However, in such a configuration, the beam dispersion may be adversely affected. A beam dispersion compensator 161 may be employed to mitigate the effects of overall beam dispersion of primary beamlets (102_1, 102_2, and 102_3). Thus, multi-beam apparatus 216A, including a beam dispersion compensator 161 in combination with an image plane 2 formed away from beam separator may be useful in improving the imaging resolution.

Figure 4G:
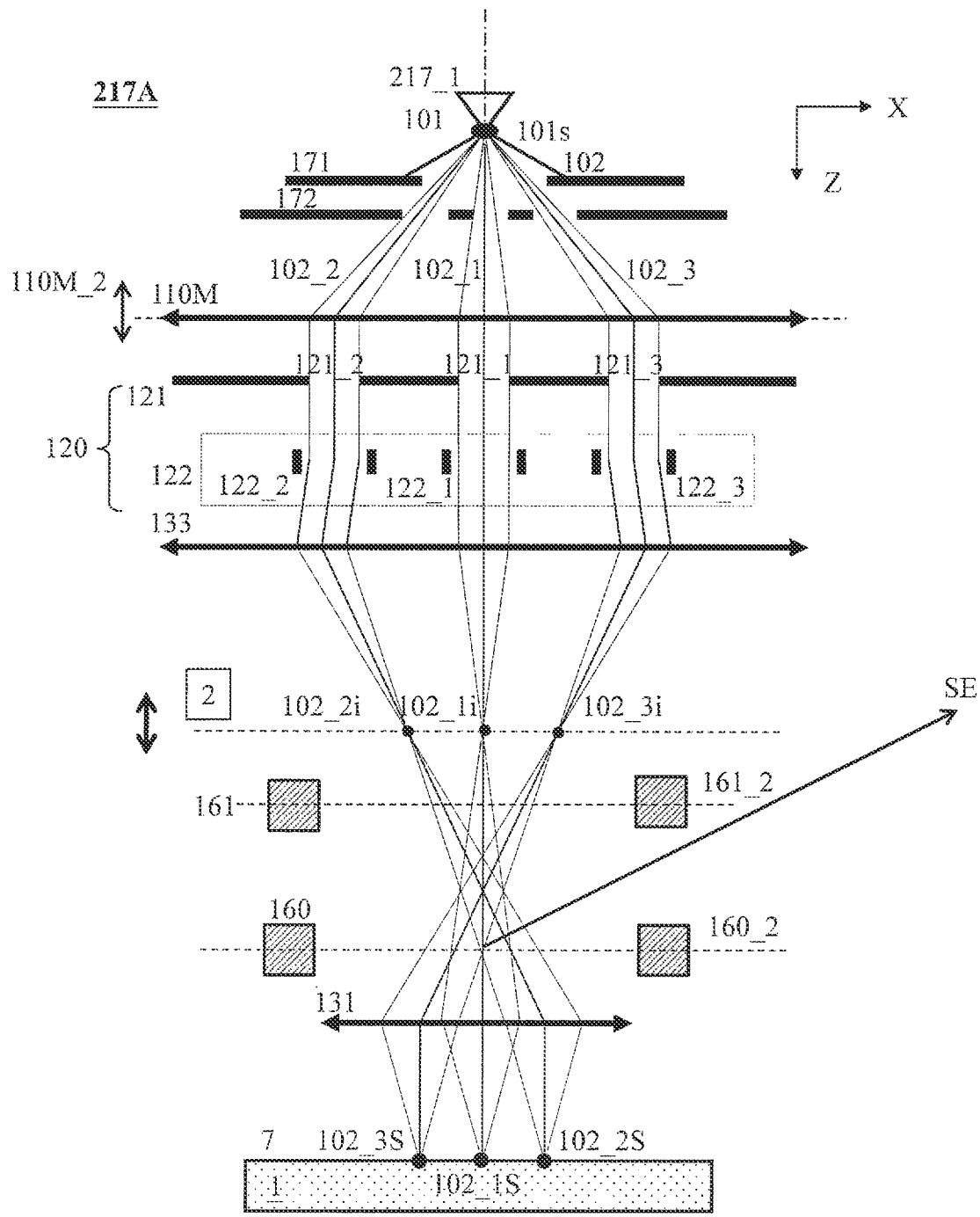

Reference is now made to FIG. 4G, which illustrates an exemplary multi-beam apparatus 217A, consistent with embodiments of the present disclosure. In comparison with embodiment of multi-beam apparatus 216A shown in FIG. 4F, multi-beam apparatus 217A may also include pre-beamlet-forming mechanism 172. Pre-beamlet-forming mechanism 172 may comprise a Coulomb aperture array, provided above movable condenser lens 110M and close to electron source 101. In FIG. 4G, primary electron beam 102 passes through the three pre-trimming apertures, and much of the remaining part of primary electron beam 102 is trimmed off. That is, pre-beamlet-forming mechanism 172 may trim most of the electrons from primary electron beam 102 that do not form the three beamlets 102_1, 102_2 and 102_3 to reduce the Coulomb effect above beam-limit aperture array 121. The shapes and sizes of the plurality of pre-trimming apertures may be adjusted to maximize the reduction of Coulomb effect.

In addition to reducing the Coulomb effect by introducing pre-beamlet-forming mechanism 172, embodiment of multi-beam apparatus 217A includes transfer lens 133 configured to form real images of primary beam crossover 101s on intermediate, image plane 2 representing the focal length of transfer lens 133. The location of intermediate image plane 2 may be adjusted by varying the electrical excitation of transfer lens 133. The change in electrical excitation may cause a change in the focal length, thereby varying the magnification to improve resolution. Furthermore, embodiment of multi-beam apparatus 217A includes beam dispersion compensator 161 configured to compensate for dispersion of beamlets 102_1, 102_2 and 102_3 caused by beam separator 160.

Figure 5A:
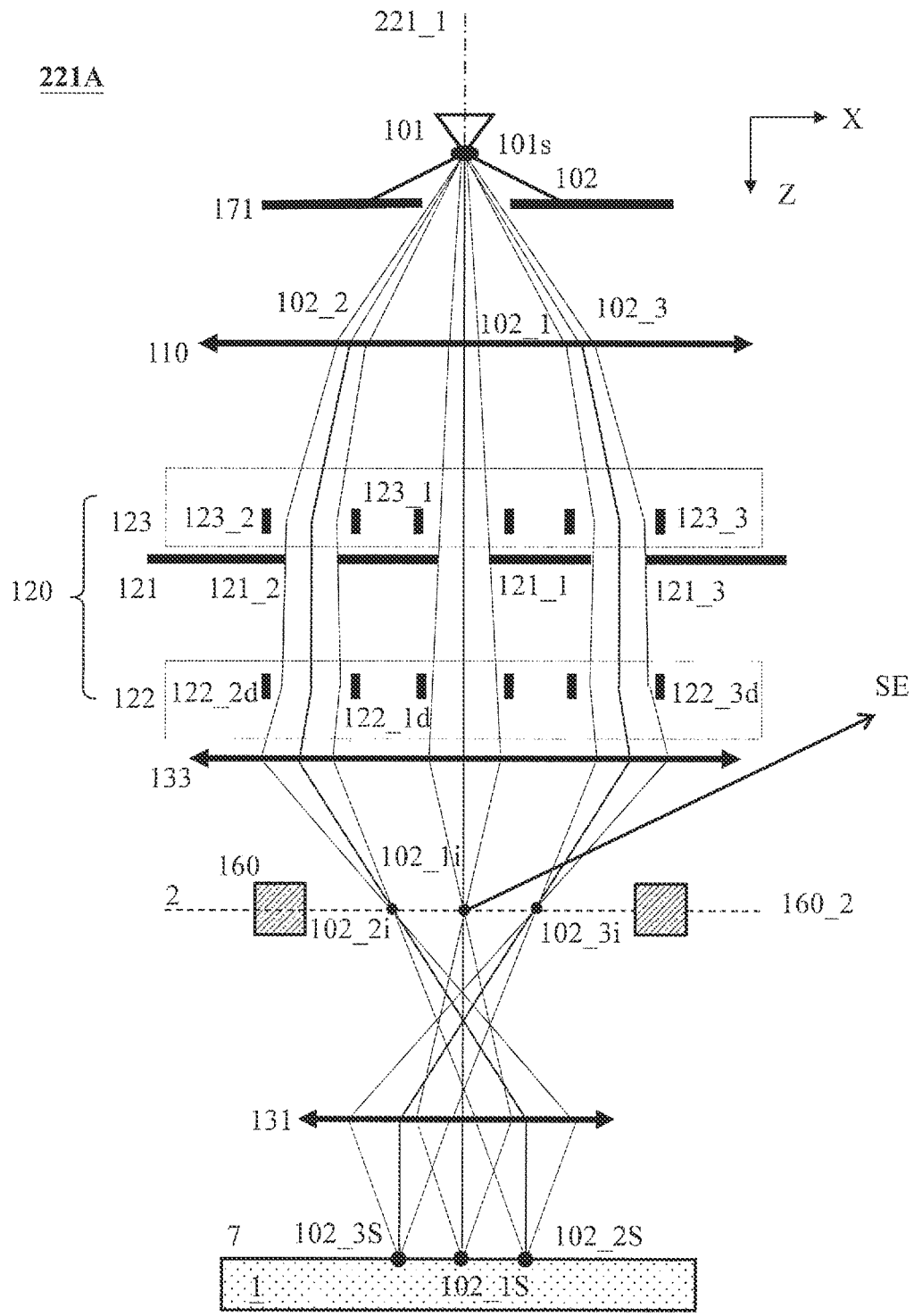
FIGS. 5A, 5B, and 5C illustrate exemplary electron beam inspection tools consistent with embodiments of the present disclosure.

Reference is now made to FIG. 5A, which illustrates an exemplary multi-beam apparatus 221A, consistent with embodiments of the present disclosure. Apparatus 221A may operate in a divergent mode, among others (e.g., a convergent or parallel mode). In a divergent mode, rather than collimating primary electron beam 102 to a parallel (or substantially parallel) beam, condenser lens 110 may be configured to focus electron beam 102 only to a certain degree to form electron beam 102 as a divergent beam. In a divergent mode, current density of primary electron beam 102 may be made smaller than that when operating in parallel mode. Therefore, currents of beamlets 102_1, 102_2, and 102_3 may be reduced.

Apparatus 221A may be provided with pre-beamlet-bending deflector array 123 that may include pre-bending micro-deflectors. For example, pre-beamlet-bending deflector array 123 may comprise pre-bending micro-deflectors 123_1, 123_2, and 123_3. Pre-beamlet-bending deflector array 123 may be provided to deflect beamlets 102_1, 102_2, and 102_3 to be parallel to primary optical axis 221_1 and normally incident onto beam-limit aperture array 121. Pre-beamlet-bending deflector array 123 may deflect the beamlets to reduce electron scattering that may be caused due to beamlets entering beam-limit apertures 121_1, 121_2, and 121_3 at an angle. Electron scattering in beamlets may enlarge the respective probe spot size or contribute to background noise and therefore deteriorate the image resolution of the corresponding scanned region.

Condenser lens 110 may be configured to focus electron beam 102 so as to make beamlets 102_1, 102_2, and 102_3 have desired currents after passing through beam-limit apertures 121_1, 121_2, and 121_3. Source conversion unit 120 may be provided with beam-limit aperture array 121, image-forming element array 122, and pre-beamlet-bending deflector array 123. Beam-limit aperture array 121 may limit sizes or currents of beamlets 102_1, 102_2, and 102_3 to a desired level. Image-forming element array 122 may comprise image-forming micro-deflectors 122_1d, 122_2d, and 122_3d that may be configured to form virtual images of primary beam crossover 101s.

Transfer lens 133 may focus beamlets 102_1, 102_2, and 102_3, and project the virtual images of primary beam crossover 101s onto image plane 2 to form real images 102_1i, 102_2i, and 102_3i. Objective lens 131 may project images 102_1i, 102_2i, and 102_3i onto sample 1 to form probe spots 102_1S, 102_2S, and 102_3S on surface 7.

Image-forming micro-deflectors 122_1d, 122_2d, and 122_3d may be configured to deflect beamlets 102_1, 102_2, and 102_3 so that probe spots 102_1S, 102_2S, and 102_3S are spaced apart from one another on sample surface 7.

In some embodiments, image-forming micro-deflectors 122_1d, 122_2d, and 122_3d may be used to adjust beamlets 102_1, 102_2, 102_3 to land on sample surface 7 perpendicularly or reduce aberrations of probe spots 102_1S, 102_2S, and 102_3S.

In apparatus 221A, source conversion unit 120 may be configured so that beamlets 102_1, 102_2, and 102_3 travel through source conversion unit substantially parallel to primary optical axis 221_1. Beamlets 102_1, 102_2, and 102_3 may travel straight through respective elements of pre-beamlet-bending deflector array 123, beam-limit aperture array 121, and image-forming element array 122. Beamlets having straight trajectories through source conversion unit 120 may reduce aberrations of beam-limit aperture array 121 and image-forming element array 122. Additionally, layers of source conversion unit 120 may be made compact. Furthermore, manufacturing of source conversion unit 120 may be made more efficient.

Figure 5B:
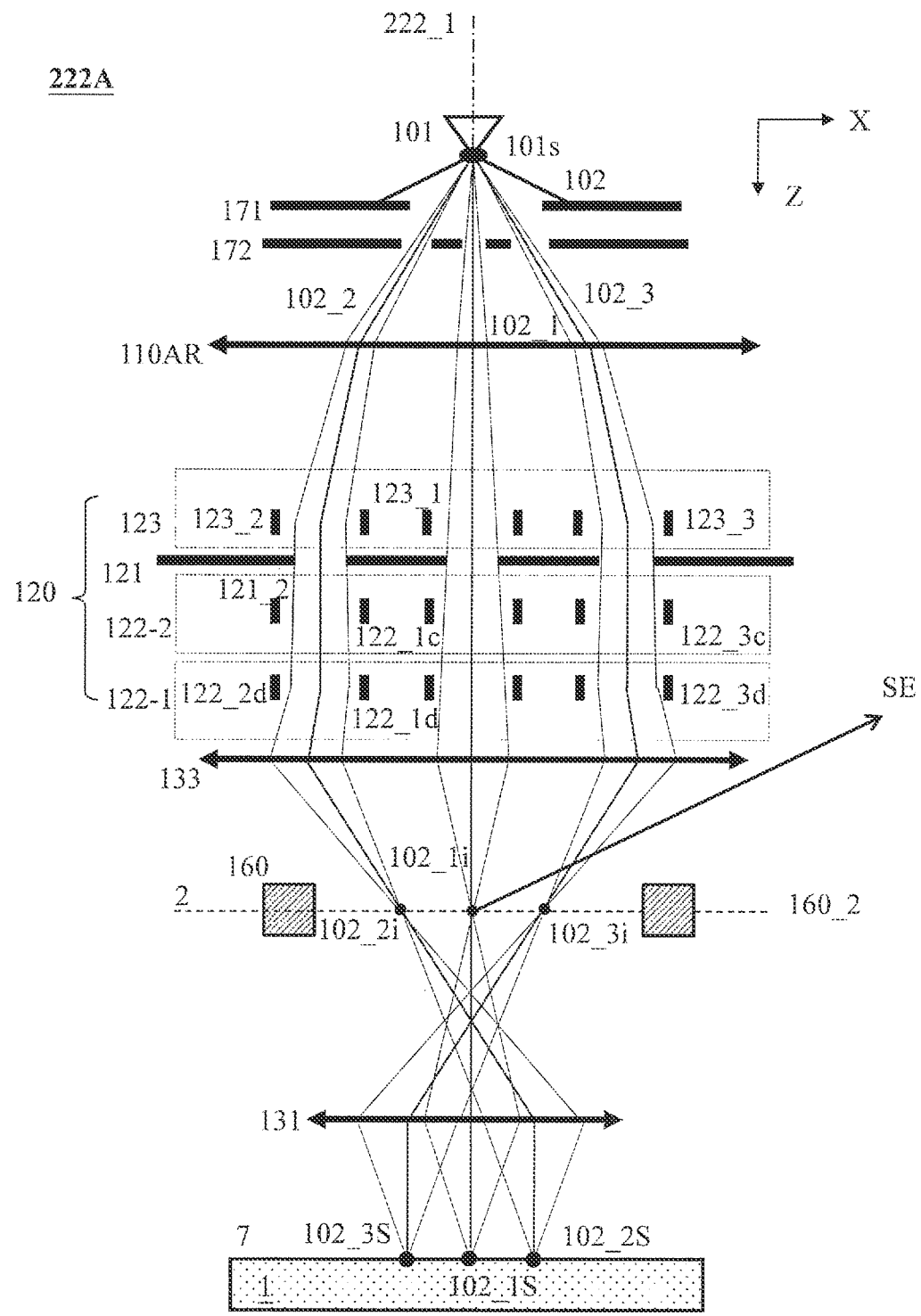

Reference is now made to FIG. 5B, which illustrates an exemplary multi-beam apparatus 222A, consistent with embodiments of the present disclosure. In comparison with the embodiment of apparatus 221A shown in FIG. 5A, apparatus 222A also includes a pre-beamlet-forming mechanism 172 and an aberration-compensator array 122-2. Pre-beamlet-forming mechanism 172 may comprise a Coulomb aperture array. A central aperture of pre-beamlet-forming mechanism and a central deflector of aberration-compensator array 122-2 may be aligned with a primary optical axis 222_1 of apparatus 222A. Furthermore, apparatus 222A may be provided with anti-rotation condenser lens 110AR.

Electrons from primary electron beam 102 generated by electron source 101 may be trimmed from around the three beamlets 102_1, 102_2, and 102_3 by beamlet-forming apertures of pre-beamlet-forming mechanism 172. When changing focusing power of anti-rotation condenser lens 110AR to vary currents of beamlets 102_1, 102_2, and 102_3, rotation angles of beamlets 102_1, 102_2, and 102_3 on source conversion unit 120 may be kept unchanged so that beamlets 102_1, 102_2, and 102_3 can pass through pre-beamlet-bending deflector array 123, beam-limit aperture array 121 and image-forming element array 122.

Anti-rotation condenser lens 110AR may be an anti-rotation lens. An anti-rotation lens may have a focusing power that can be changed without influencing a rotation angle of electron beams passing therethrough. Examples of anti-rotation lens are provided in International Application No. PCT/EP2017/084429, which is incorporated by reference in its entirety. An anti-rotation lens may be formed by two lenses. For example, an anti-rotation lens may be formed by two magnetic lenses or by one magnetic lens and one electrostatic lens. By appropriately adjusting excitation of the lenses inside the anti-rotation lens, focusing power of the lens can be varied without affecting the rotation angle of the electron beam passing therethrough.

Anti-rotation condenser lens 110AR may be a movable anti-rotation lens (MARL). In the case of a MARL, anti-rotation condenser lens 110AR may be formed by three lenses. Examples of movable anti-rotation lens are also provided in International Application No. PCT/EP2017/084429.

Pre-beamlet-forming mechanism 172 may be provided with a plurality of pre-trimming apertures that may help to form beamlets 102_1, 102_2, and 102_3. Anti-rotation condenser lens 110AR may help to ensure that beamlets 102_1, 102_2, and 102_3 pass through respective openings of beamlet-limit mechanism 121.

Source conversion unit 120 may be provided with image-forming element array 122-1 and aberration-compensator array 122-2. Image-forming element array 122-1 of apparatus 222A may be the same as image-forming element array 122 of apparatus 221A as shown in FIG. 5A. Image-forming element array 122-1 may comprise an array of image-forming micro-deflectors 122_1d, 122_2d, and 122_3d that may be set so that beamlets 102_1, 102_2, and 102_3 land on sample 1 perpendicularly or so that probe spots 102_1S, 102_2S and 102_3S have small aberrations. Aberration-compensator array 122-2 may comprise an array of aberration compensators 122_1c, 122_2c, and 122_3c that may compensate for field curvature aberration or astigmatism aberration of probe spots 102_1S, 102_2S and 102_3S.

Figure 5C:
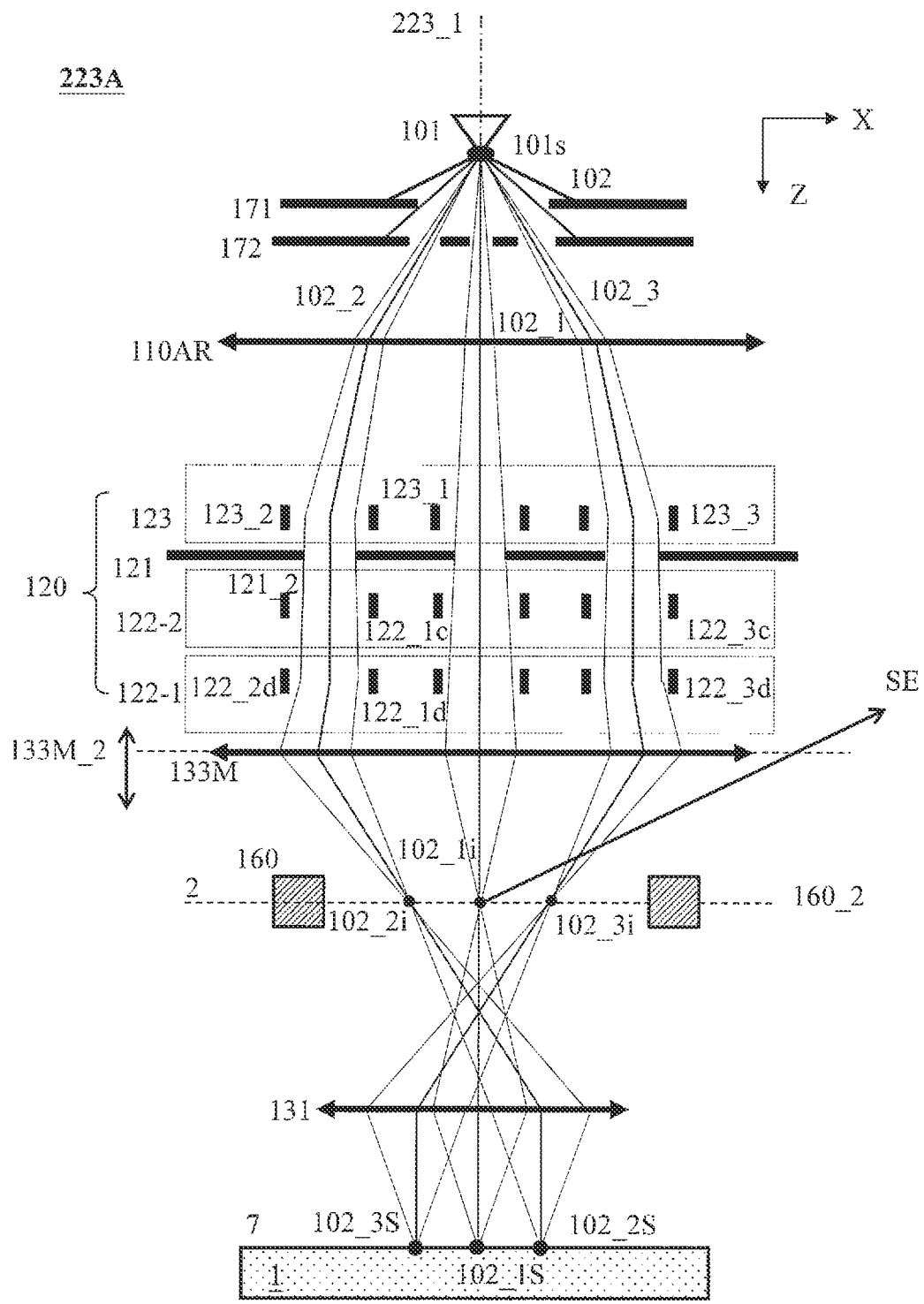

Reference is now made to FIG. 5C, which illustrates an exemplary multi-beam apparatus 223A, consistent with embodiments of the present disclosure. In comparison with the embodiments of apparatus 222A shown in FIG. 5B, apparatus 223A may include a movable transfer lens 133M that may replace, for example transfer lens 133 in the embodiment of apparatus 222A. Movable transfer lens 133M may be aligned with a primary optical axis 223_1 of apparatus 223A.

Movable transfer lens 133M may have a principal plane 133M_2 at a predetermined position and may be moved along primary optical axis 223_1 of the apparatus. For example, principal plane 110M_2 may be moved closer or further away from source conversion unit 120. Adjusting the position of movable transfer lens 133M may affect the position of images 102_1i, 102_2i, and 102_3i formed in image plane 2 and thus change the pitches of probe spots 102_1S, 102_2S, and 102_3S on sample 1.

Figure 6A:
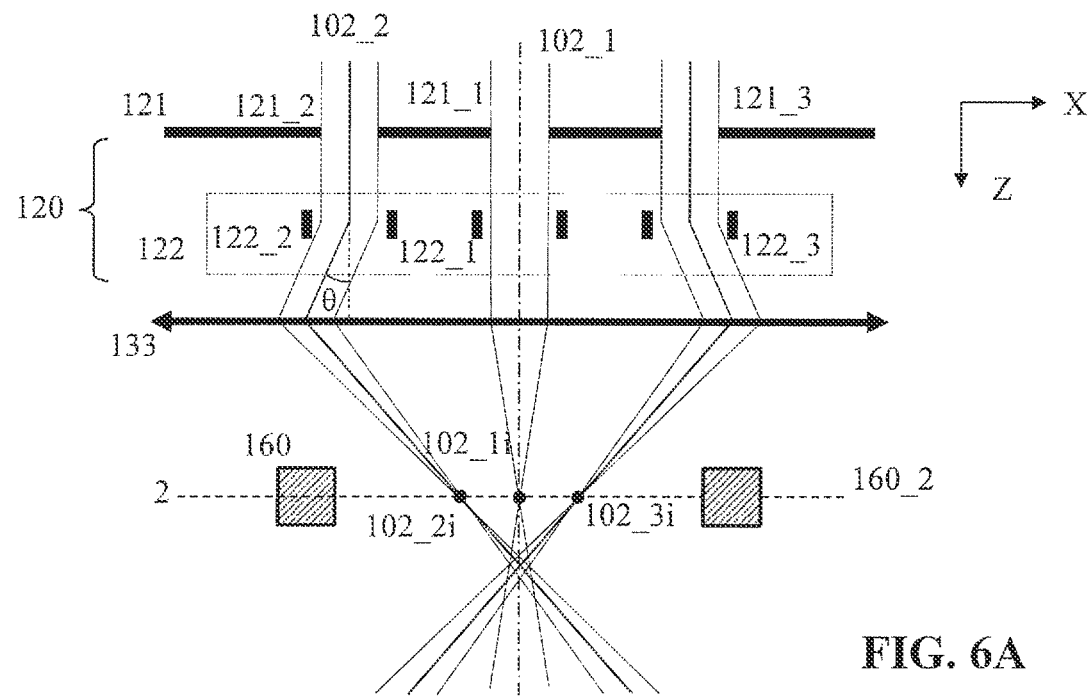
FIGS. 6A and 6B illustrate portions of exemplary electron beam inspection tools consistent with embodiments of the present disclosure.
Figure 6B:
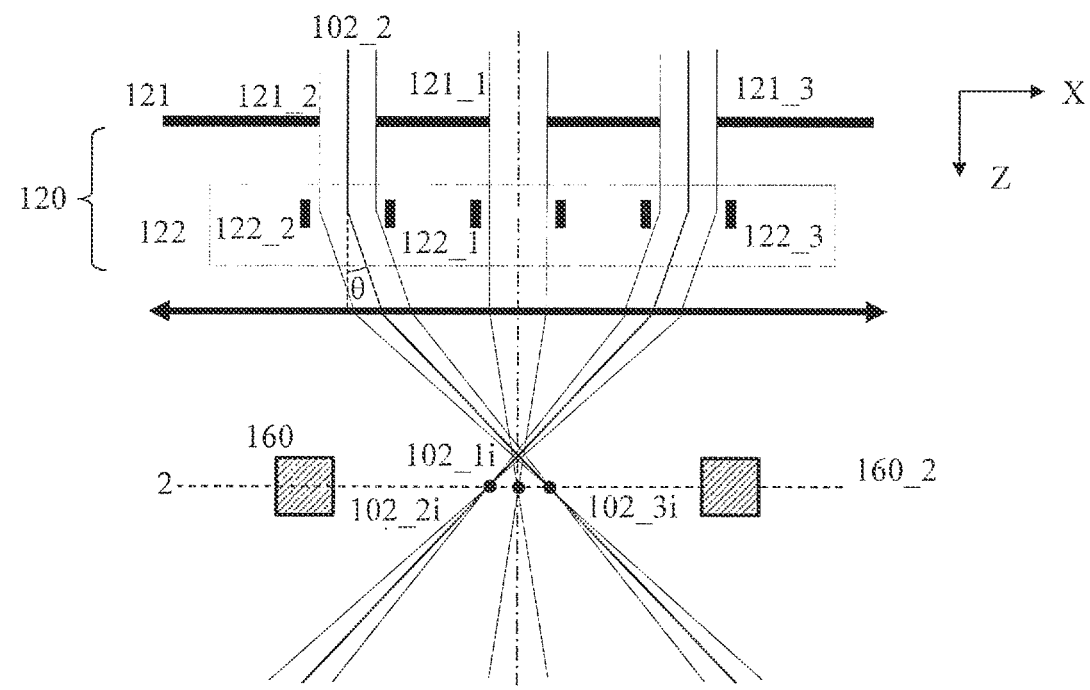

FIG. 6A and FIG. 6B illustrate exemplary deflection angle adjustments in image-forming element array 122, consistent with embodiments of the present disclosure. The arrangements of FIG. 6A and FIG. 6B may form portions of the exemplary embodiments discussed herein. A deflector may be configured to deflect a beam generated from an electron source. The deflector may be a part of an array of deflectors, such as deflectors 122_1, 122_2, and 122_3 of image-forming element array 122. Deflectors 122_1, 122_2, and 122_3 may be configured to deflect beams symmetrically about an optical axis (Z-axis). In the side view of the embodiment of FIG. 6A, deflector 122_1 may be configured to deflect beamlet 102_1 in a direction out of the paper.

Deflector 122_2 is an example of a deflector. As shown in FIG. 6A, deflector 122_2 deflects beamlet 102_2 radially outward and with a deflection angle of $\theta$ relative to the Z-axis. As angle $\theta$ increases, beamlet separation may be increased. Accordingly, images 102_1i, 102_2i, and 102_3i may be formed with increased separation distance on image plane 2. Beam spots, such as probe spots 102_1S, 102_2S, and 102_3S, may be formed with increased pitch.

Image-forming element array 122 may comprise a 3×3 array of deflectors. A central deflector of a 3×3 array of deflectors may be aligned with the primary optical axis of the apparatus and may thus be configured to maintain the trajectory of a central beam to be straight. The central deflector may also be omitted. In some embodiments, more or less deflectors may be provided. For example, an 11×11 array of deflectors may be provided. All deflectors of an array may be configured to generate desired deflection angles to beams passing therethrough. In some embodiments, some deflectors may be configured to deflect beams passing therethrough with different deflection angles. In embodiments where more deflectors are provided, for example, deflectors positioned radially outward may be configured to generate larger deflection angles on beams.

As shown in FIG. 6B, beamlets may also be deflected radially inward toward the primary optical axis. When beamlets are deflected inward, a beam crossover may be formed before beamlets reach beam separator 160. Furthermore, deflecting beamlets inward may cause beamlets to have a much greater beam separation upon reaching objective lens 103, and thus the beamlets may form probe spots on a sample with much larger aberrations.

When a movable transfer lens is employed, deflectors image-forming element array 122 may be configured to deflect beamlets with deflection angles that are based cm an amount of displacement of the principal plane of the movable transfer lens from a reference position. Deflectors may be configured to deflect beamlets within a predetermined range of deflection angles. The amount of deflection imparted by a deflector may be determined by a voltage applied to the deflector.

In some embodiments, deflectors may be configured to generate small deflection angles. For example, multiple deflectors may be used to adjust a single beamlet so as to collectively deflect the beamlet with an angle larger than individual small deflection angles. A benefit of such small deflection angles may be that the deflector arrays may be easier to manufacture, and lower electric excitation may be required. Furthermore, such configuration may be more power efficient.

Figure 7:
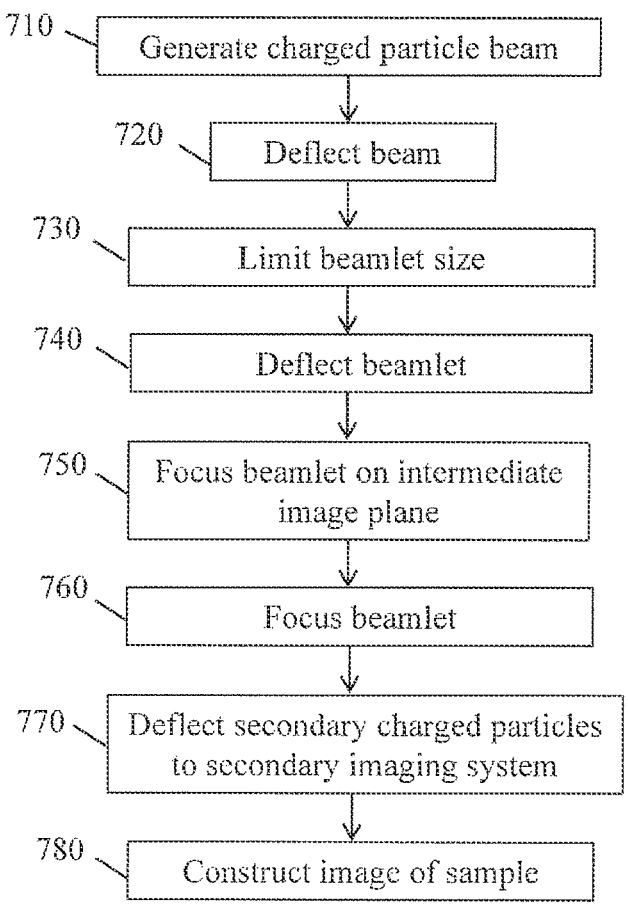
FIG. 7 is a flowchart representing an exemplary method for forming beams, consistent with embodiments of the present disclosure.

FIG. 7 is a flowchart illustrating an exemplary method 700 for forming beams, consistent with embodiments of the present disclosure. Method 700 may be performed by controller 19 of EBI system 10, as shown in FIG. 1, for example. Controller 19 may be programmed to implement one or more blocks of method 700. For example, controller 19 may instruct a module of a charged particle beam apparatus to generate a charged particle beam and carry out other functions.

In step 710, a charged particle beam may be generated by a charged particle source. For example, electron source 101 may be controlled to emit primary electron beam 102 that is formed along a primary optical axis. Step 710 may comprise generating a plurality of beamlets. Primary electron beam 102 may be trimmed by gun aperture 171 or pre-beamlet-forming mechanism 172. Step 710 may comprise focusing primary electron beam 102. Primary electron beam 102 may be focused by condenser lens 110. Focusing primary electron beam 102 may comprise generating an electric field or a magnetic field. Primary electron beamlets 102_1, 102_2, and 102_3 may be guided toward source conversion unit 120.

In step 720, the charged particle beam may be deflected by a deflector. For example, primary electron beam 102 that comprises beamlets 102_1, 102_2, and 102_3 may be deflected by a deflector of pre-beamlet-bending deflector array 123. Primary beam 102 may be deflected so that beamlets 102_1, 102_2, and 102_3 are made parallel to the primary optical axis and normally incident onto beam-limit array 121. A voltage may be supplied to the deflectors.

In step 730, the size of beamlets may be limited. For example, sizes of beamlets 102_1, 102_2, and 102_3 may be limited by being made to pass through respective openings of beam-limit array 121.

In step 740, a beamlet may be deflected by a deflector. For example, beamlets 102_1, 102_2, and 102_3 may be deflected by individual deflectors of image-forming element array 122. Individual deflectors of image-forming element array 122, such as deflectors 122_1, 122_2, and 122_3 may be controlled to deflect beamlets 102_1, 102_2, and 102_3 by deflection angle θ. A voltage may be supplied to the deflectors. Deflecting a beamlet in step 740 may comprise, deflecting the beamlet in a direction perpendicular to the primary optical axis. Beamlets may be deflected radially outward. Step 740 may comprise forming a virtual image of primary beam crossover 101s of charged particle source 101. Deflection angles may be set so that beamlets 102_1, 102_2, and 102_3 land perpendicularly on sample 1. The deflection angles may be based on properties of transfer lens 133 and objective lens 131.

In step 750, a beamlet may be focused on an intermediate image plane. For example, beamlets 102_1, 102_2, and 102_3 may be focused by transfer lens 133 onto image plane 2. A plurality of intermediate real images 102_1i, 102_2i, and 102_3i of primary beam crossover 101s may be formed on image plane 2. Image plane 2 may be at least near beam separator 160 that is configured to separate primary charged particles and secondary charged particles. Transfer lens 133 may be controlled to generate an electric field or a magnetic field. Step 750 may comprise controlling a movable lens to adjust a separation of images formed in image plane 2. For example, movable transfer lens 133 may be moved so as to adjust a separation distance between intermediate real images 102_1i, 102_2i, and 102_3i and to adjust pitches of probe spots 102_1S, 102_2S and 102_3S.

In step 760, a beamlet may be focused onto a target. For example, beamlets 102_1, 102_2, and 102_3 may be focused by objective lens 131 onto sample 1 for inspection and may form probe spots 102_1S, 102_2S, and 102_3S on surface 7. Adjusting the separation distance between intermediate real images 102_1i, 102_2i, and 102_3i in step 750 may change pitches of probe spots 102_1S, 102_2S and 102_3S. Setting deflection angles in step 740 may reduce aberrations of probe spots 102_1S, 102_2S and 102_3S.

In step 770, secondary electrons may be deflected to be directed toward a secondary imaging system. For example, in response to illumination by primary beamlets 102_1, 102_2, and 102_3 at probe spots 102_1S, 102_2S, and 102_3S, secondary electrons may emerge from sample 1 to form secondary electron beams 102_1se, 102_2se, and 102_3se that may be directed to secondary imaging system 150. Beam separator 160 may be controlled to deflect secondary electron beams 102_1so, 102_2se, and 102_3se toward secondary imaging system 150. Secondary imaging system 150 may subsequently focus secondary electron beams 102_1se, 102_2se, and 102_3se onto detection elements 140_1, 140_2, and 140_3 of electron detection device 140M.

In step 780, an image of a sample may be constructed. For example, detection elements 140_1, 140_2, and 140_3 may detect corresponding secondary electron beams 102_1se, 102_2se, and 102_3se and generate corresponding signals that may be sent to signal processing units to construct images of the corresponding scanned areas of sample 1.

Figure 8:
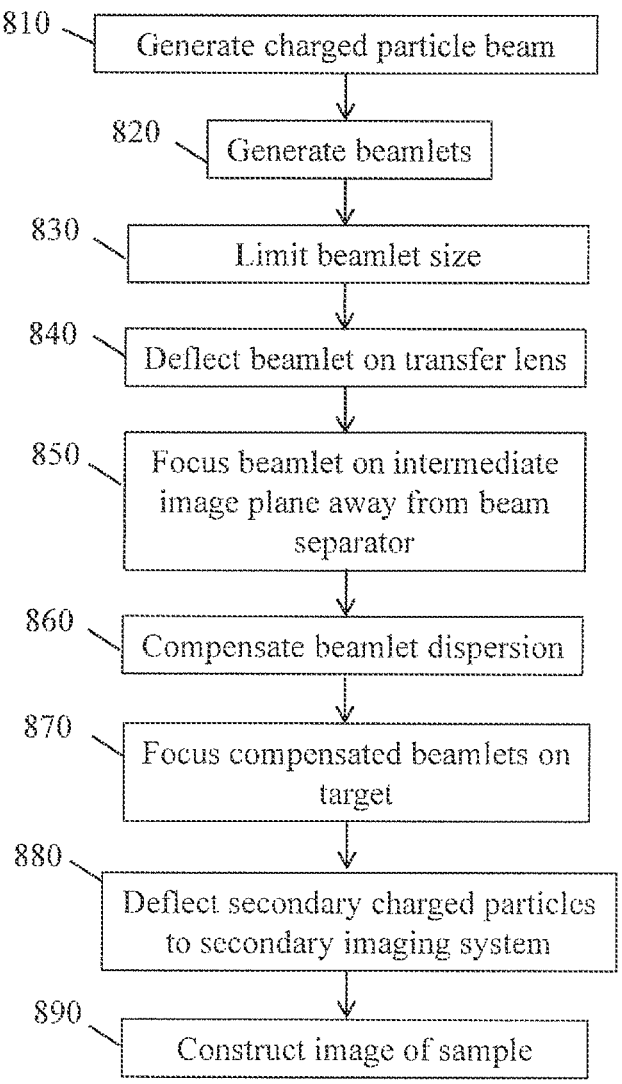
FIG. 8 is a flowchart representing an exemplary method of observing a sample using a multi-beam inspection tool, consistent with embodiments of the present disclosure.

FIG. 8 is a flowchart illustrating an exemplary method 800 of observing a sample using a multi-beam inspection tool, consistent with embodiments of the present disclosure. Method 800 may be performed by controller 19 of EBI system 10, as shown in FIG. 1, for example. Controller 19 may be programmed to implement one or more blocks of method 800. For example, controller 19 may instruct a module of a charged particle beam apparatus to generate a charged particle beam and carry out other functions.

In step 810, a charged particle beam (e.g., primary electron beam 102 of FIG. 2A) may be generated by a charged particle source (e.g., electron source 101 of FIG. 2A). For example, electron source 101 may be controlled to emit primary electron beam 102 that is formed along a primary optical axis. The primary electron beam may be trimmed by a gun aperture plate (e.g., gun aperture plate 171 of FIG. 2A) or an aperture array (e.g., pre-beamlet-forming mechanism 172 of FIG. 4B), or both.

In step 820, a plurality of beamlets (e.g., beamlets 102_1, 102_2, and 102_3) may be generated after passing through the pre-beamlet-forming mechanism. The number of beamlets generated may be based on the number of pre-trimming apertures of the pre-beamlet-forming mechanism. For illustrative purposes, three beamlets and three pre-trimming, apertures are shown in, for example, FIG. 4A. Step 820 may comprise focusing the beamlets by a condenser lens (e.g., condenser lens 110M of FIG. 4A). In embodiment of multi-beam apparatus 214A shown in FIG. 4D, for example, condenser lens may focus the primary electron beam. Focusing the primary electron beam or the beamlets may comprise generating an electric field or a magnetic field. In some embodiments, condenser lens may be configured to collimate the beamlets or the primary electron beam. The beamlets 102_1, 102_2, and 102_3 may be guided toward source conversion unit 120.

In step 830, the size of beamlets may be limited. For example, sizes of beamlets 102_1, 102_2, and 102_3 may be limited by being made to pass through respective openings of a beam-limit array (e.g., beam limit array 121 of FIG. 4A). Although reducing the size of the beamlets may reduce the beam current, it may help generate smaller probe spots and a substantially uniform electron energy distribution within the cross-section of the beamlet. This may enable improving the imaging resolution, among other things.

In step 840, one or more beamlets may be deflected by a beam deflector (e.g., image-forming element array 122 of FIG. 4A) on a transfer lens (e.g., transfer lens 133 or FIG. 4D). For example, beamlets 102_1, 102_2, and 102_3 may be deflected by individual deflectors of the image-forming element array. It is appreciated that on-axis beamlet 102_1 may not be deflected. Individual deflectors of the image-forming element array, such as deflectors 122_1, 122_2, and 122_3 may be controlled to deflect beamlets 102_1, 102_2, and 10_3, respectively, by applying a voltage signal to the deflectors. For example, a voltage signal may be applied to deflectors 122_2 and 122_3 to deflect the beamlets 102_2 and 102_3, respectively, while no voltage signal may be applied to deflector allowing the beamlet 102_1 to pass through without any deflection, as shown in, for example, FIG. 4D.

Deflecting a beamlet in step 840 may comprise deflecting one or more beamlets radially outward to be incident on a transfer lens (e.g., transfer lens 133 of FIG. 4D).

In step 850, the beamlets may be focused on an intermediate image plane (e.g., image plane 2). For example, the beamlets may be focused by the transfer lens onto the image plane. A plurality of intermediate real images (e.g., intermediate real images 102_1i, 102_2i, and 102_3i of FIG. 4D) of a beam crossover (e.g., primary beam crossover 101s) may be formed on the image plane. The image plane may be formed away from a beam separator (e.g., beam separator 160) that is configured to separate primary charged particles and secondary charged particles. The transfer lens may be controlled to generate an electric field or a magnetic field. Step 850 may comprise controlling a movable lens to adjust a separation of images formed in image plane. For example, a movable transfer lens (e.g., movable transfer lens 133M of FIG. 5C) may be moved in a direction parallel to the primary optical axis so as to adjust a horizontal separation distance between the intermediate real images and to adjust pitches of probe spots (e.g., probe spots 102_1S, 102_2S and 102_3S of FIG. 4D).

In some embodiments, the transfer lens is stationary, as shown in FIG. 4D. The focal length of the transfer lens may be adjusted by varying the electrical excitation. Changing the focal length of the transfer lens may vary the position of the intermediate image plane, thereby changing the magnification of the beamlets and the size of the probe spots formed.

In step 860, a beam dispersion compensator (e.g., beam dispersion compensator 161 of FIG. 4F) may compensate the dispersion of one or more beamlets based on a determined dispersion of primary beamlets passing through the beam separator. Forming the intermediate image plane away from the beam separator may increase beam dispersion, causing a loss of image resolution. To mitigate this issue, the beam dispersion compensator may disperse the beamlets accordingly. The beam dispersion compensator may, for example, comprise a Wien filter.

In step 870, the compensated beamlets may be focused onto a target (e.g., sample 1) objective lens (e.g., objective lens 131 of FIG. 4D) for inspection and may form probe spots 102_1S, 102_2S, and 102_3S on a surface of the sample (e.g., surface 7 of FIG. 4D). Adjusting the horizontal separation distance between intermediate real images 102_1i, 102_2i, and 102_3i in step 850 may change pitches of probe spots. If the pitches of probe spots are too small, cross-talk between neighboring beamlets may affect the beamlet size, therefore affecting the imaging resolution.

In step 880, secondary electrons may be deflected by the beam separator to be directed toward a secondary imaging system (e.g., secondary imaging system 150 of FIG. 2A). The beam separator may be controlled to deflect secondary electron beams (e.g., secondary electron beams 102_1se, 102_2se, and 102_3se of FIG. 2A) toward the secondary imaging system. The secondary imaging system may subsequently focus the secondary electron beams onto detection elements (e.g., detection elements 140_1, 140_2, and 140_3 of FIG. 2A) of an electron detection device (e.g., electron detection device 140M of FIG. 2A).

In step 890, an image of a probed region of the sample may be constructed. For example, detection elements 140_1, 140_2, and 140_3 may detect corresponding secondary electron beams and generate corresponding signals that may be sent to a signal processing unit to construct images of the corresponding scanned areas of the sample.

The embodiments may further be described using the following clauses:

1. A charged particle optical system comprising:
   a first deflector array configured to deflect a plurality beamlets of a primary charged particle beam generated by a source;
   a first lens configured to focus the plurality of beamlets to form a plurality of images of the source on an image plane; and
   an objective lens configured to protect the plurality of mages onto a sample and form a plurality of probe spots thereon,
2. The charged particle optical system of clause 1, further comprising:
   a beam separator configured to separate the plurality of beamlets and secondary charged particles emitted from the sample due to illumination by the plurality of probe spots.
3. The charged particle optical system of clause 2, wherein the image plane is at least near the beam separator.
4. The charged particle optical system of clause 3, wherein deflection angles of the plurality of beamlets deflected by the first deflector array are set to obtain a predetermined pitch of the plurality of probe spots and to decrease aberrations thereof.
5. The charged particle optical system of any of clauses 1 to 4, further comprising a first aperture array above the first deflector array and configured to limit currents of the plurality of probe spots.
6. The charged particle optical system of clause 5, further comprising a second lens between the charged particle source and the first aperture array and configured to focus the primary charged particle beam.
7. The charged particle-optical system of clause 6, wherein the second lens is configured focus the primary charged particle beam as a parallel beam.
8. The charged particle optical system of clause 7, wherein the second lens is a movable lens configured to change the currents of the plurality of probe spots.
9. The charged particle optical system of clause 7 or clause 8, further comprising compensator array configured to compensate aberrations of the plurality of probe spots.
10. The charged particle optical system of any of clauses 7 to 9, further comprising a main aperture above the second lens, close to the source and configured to cut off a peripheral portion of the primary charged particle beam not used in the plurality of beamlets.
11. The charged particle optical system of clause 10, further comprising a second aperture array between the main aperture and the first aperture array and configured to cut off portions of the primary charged particle beam not used in the plurality of beamlets.

12. The charged particle optical system of clause 11, wherein the second aperture array is above the second lens and close to the source.

13. The charged particle optical system of clause 9, further comprising a second aperture array above the second lens, close to the source and configured to cut off portions of the primary charged particle beam not used in the plurality of beamlets.

14. The charged particle optical system of clause 6, further comprising a second deflector array configured to deflect the plurality of beamlets to be normally incident onto the first aperture array.

15. The charged particle optical system of clause 14, further comprising a compensator array configured to compensate aberrations of the plurality of probe spots.

16. The charged particle optical system of clause 15, further comprising a main aperture above the second lens, close to the source and configured to cut off a peripheral portion of the primary charged particle beam not used in the plurality of beamlets.

17. The charged particle optical system of clause 16, further comprising a second aperture array between the main aperture and the first aperture array and configured to cut off portions of the primary charged particle beam not used in the plurality of beamlets.

18. The charged particle optical system of clause 17, wherein the second aperture array is above the second lens and close to the source.

19. The charged particle optical system of clause 17, wherein the second aperture array is below the second lens.

20. The charged particle optical system of clause 15, further comprising a second aperture array above the second lens, close to the source and configured to cut off portions of the primary charged particle beam not used in the plurality of beamlets.

21. The charged particle optical system of any of clauses 18 or 19, wherein the second lens is an anti-rotation lens configured to change currents of the plurality of beamlets below the first aperture array and keep rotation angles of the plurality of beamlets on the first aperture array unchanged.

22. The charged particle optical system of any of clauses 12, 13 or 21, wherein the first lens is a movable lens configured to change pitches of the plurality of probe spots.

23. The charged particle optical system of any of clauses 1, 12, 13 or 21, wherein the image plane is configured to ensure sizes of the plurality of probe spots relatively increase within 20% due to dispersions of the beam separator on the plurality of beamlets.

24. The charged particle optical system of clause 23, wherein the image plane is at a deflection plane of the beam separator.

25. A charged particle optical system comprising:
a first deflector configured to deflect a beamlet of a charged particle beam generated by a charged particle source; and
a first lens configured to focus the beamlet to form an image of the charged particle source on an image plane within a region of a beam separator that is configured to separate the beamlet and secondary charged particles generated from a sample in response to charged particles of the beamlet interacting with the sample.

26. The charged particle optical system of clause 25, wherein
the first deflector is configured to deflect the beamlet toward an optical axis of the system.

27. The charged particle optical system of clause 25, wherein
the first deflector is configured to deflect the beamlet outward from art optical axis of the system.

28. A method of forming plurality of probe spots on a sample, the method comprising:
deflecting a plurality of beamlets of a beam generated by a charged particle source;
focusing the plurality of beamlets, by a lens, to form a plurality of images of the source on an image plane; and
projecting the plurality of images onto a sample to form a plurality of probe spots thereon.

29. The method of clause 28, further comprising:
separating, by a beam separator, the plurality of beamlets and secondary charged particles generated from the sample due to illumination by the plurality of probe spots.

30. The method of clause 29, wherein the image plane is at or close to a deflection plane of the beam separator.

31. The method of clause 30, further comprising:
limiting currents of the plurality of probe spots by a first aperture array.

32. The method of clause 31, further comprising:
varying the currents by changing a focusing status of the beam.

33. The method of clause 32, further comprising:
trimming, by a second aperture array above the first aperture array, portions of the beam not used in the plurality of probe spots.

34. The method of clause 33, wherein the second aperture array is close to the source.

35. The method of clause 30, further comprising:
changing a pitch of the plurality of probe spots by changing deflection angles of the plurality of beamlets.

36. The method of clause 30, further comprising:
changing pitches of the plurality of probe spots by moving a principal plane of the lens.

37. The method of clause 30, further comprising:
changing pitches of the plurality of probe spots by moving the image plane.

38. The charged particle optical system of clause 4, wherein pitches of the plurality of probe spots are different from one another.

39. The charged particle optical system of clause 22, wherein the pitches of the plurality of probe spots are different from one another.

40. The charged particle optical system of clause 4, wherein pitches of the plurality of probe spots are equal to one another.

41. The charged particle optical system of clause 22, wherein the pitches of the plurality of probe spots are equal to one another.

42. The method of clause 35, wherein pitches of the plurality of probe spots are different from one another.

43. The method of clause 36 or clause 37, wherein the pitches of the plurality of spots are different from one another.

44. The method of clause 34, wherein pitches of the plurality of probe spots are equal to one another.

45. The method of clause 36 or clause 37 wherein the pitches of the plurality of probe spots are equal to another.
46. A multi-beam apparatus, comprising:
   a first lens configured to focus a plurality of beamlets to form a plurality of images of a charged-particle source on art image plane formed closer to the first lens than a charged-particle separator that is configured to separate primary charged particles of the plurality of beamlets and secondary charged particles emitted from a sample; and
   an objective lens configured to project the plurality of images onto the sample and form a plurality of probe spots thereon.
47. The apparatus of clause 46, further comprising a first deflector array configured to deflect at least one of the plurality of beamlets of a primary charged-parade beam radially outward from a primary optical axis and incident on the first lens.
48. The apparatus of clause 47, further comprising a first aperture array disposed between the first deflector array and the charged-particle source and configured to limit probe currents of the plurality of beamlets.
49. The apparatus of array one of clauses 46 to 48, further comprising a charged-particle dispersion compensator configured to compensate dispersion caused by the charged-particle separator.
50. The apparatus of clause 49, wherein the charged-particle dispersion compensator is disposed between the charged-particle separator and the first lens.
51. The apparatus of any one of clauses 49 and 50, wherein the image plane is formed between the charged-particle dispersion compensator and the first lens.
52. The apparatus of any one of clauses 46 to 51, wherein the first lens is an adjustable lens configured to adjust a magnification of the plurality of beamlets by adjusting a location of the formed image plane.
53. The apparatus of clause 52, wherein the magnification is based on a ratio of a size of one of the plurality of probe spots to a size of a corresponding beamlet of the plurality of beamlets.
54. The apparatus of any one of clauses 46 to 53, wherein the first lens is configured to form the image plane between the first lens and the charged-particle separator.
55. The apparatus of any one of clauses 47 to 54, wherein the image plane is formed normal to the primary optical aids of the primary charged-particle beam and between the first lens and the charged-particle separator.
56. The apparatus of any one of clauses 47 to 55, further comprising a second lens disposed between the charged-particle source and the first lens and configured to focus the primary charged-particle beam.
57. The apparatus of clause 56, wherein the second lens is a movable lens disposed on a principal plane normal to the primary optical axis of the primary charged-particle beam.
58. The apparatus of clause 57, wherein the principal plane of the second lens is adjusted along the primary optical axis to adjust probe currents of the plurality of beamlets.
59. The apparatus of any one of clauses 56 to 58, further comprising an aperture plate disposed between the charged-particle source and the second lens and configured to block off a peripheral portion of the primary charged-particle beam.
60. The apparatus of any one of clauses 56 to 59, further comprising a second aperture array disposed between the aperture plate and the second lens and configured to generate the plurality of beamlets from the primary charged-particle beam.
61. The apparatus of any one of clauses 56 to 60, wherein the first lens is disposed between the second lens and the charged-particle separator.
62. A multi-beam apparatus, comprising:
   a first deflector array configured to deflect a plurality beamlets of a primary charged-particle beam;
   a first lexis configured to focus the plurality of beamlets to form a plurality of images of a charged-particle source on an image plane formed closer to the first lens than a charged-particle separator that is configured to separate primary charged particles of the plurality of beamlets and secondary charged particles emitted from a sample; and
   an objective lens configured to project the plurality of images onto the sample and form a plurality of probe spots thereon.
63. The apparatus of clause 62, wherein the first deflector array is configured to collimate at least one of the plurality of beamlets to be substantially parallel to a primary optical axis of the primary charged-particle beam.
64. The apparatus of any one of clauses 62 and 63, further comprising an aperture plate disposed between the charged-particle source and the first deflector array and configured to block off a peripheral portion of the primary charged-particle beam.
65. The apparatus of any one of clauses 63 and 64, wherein the image plane is formed normal to the primary optical axis of the primary charged-particle beam and between the first lens and the charged-particle separator.
66. The apparatus of any one of clauses 63 to 65, further comprising a second deflector array disposed between the first deflector array and the first lens and configured deflect the at least one of the plurality of beamlets radially outward from the primary optical axis and incident on the first lens.
67. The apparatus of any one of clauses 62 to 66, wherein the first lens is configured to form the image plane between the first lens and the charged-particle separator.
68. The apparatus of any one of clauses 62 to 67, further comprising a first aperture array disposed between the first lens and the charged-particle source and configured to limit probe currents of the plurality of beamlets.
69. The apparatus of any one of clauses 62 to 68, wherein the first lens is an adjustable lens configured to adjust a magnification of the plurality of beamlets by adjusting a location of the formed image plane.
70. The apparatus of clause 69, wherein the magnification is based on a ratio of a size of one of the plurality of probe spots to a size of a corresponding beamlet of the plurality of beamlets.
71. The apparatus of any one of clauses 62 to 70, further comprising a charged-particle dispersion compensator configured to compensate dispersion caused by the charged-particle separator.
72. The apparatus of clause 71, wherein the charged-particle dispersion compensator is disposed between the charged-particle separator and the first lens.

73. The apparatus of any one of clauses 71 and 72, wherein the image plane is formed between the charged-particle dispersion compensator and the first lens.
74. The apparatus of any one of clauses 62 to 73, further comprising a second lens disposed between the charged-particle source and the first lens and configured to focus the primary charged-particle beam.
75. The apparatus of clause 74, wherein the second lens is a movable lens disposed on a principal plane normal to the primary optical axis of the primary charged-particle beam.
76. The apparatus of clause 75, wherein the principal plane of the second lens is adjusted along the primary optical axis to adjust probe currents of the plurality of beamlets.
77. The apparatus of any one of clauses 74 to 76, wherein the first lens is disposed between the second lens and the charged-particle separator.
78. The apparatus of any one of clauses 74 to 77, further comprising a second aperture array disposed between the aperture plate and the second lens and configured to generate the plurality of beamlets from the primary charged-particle beam.
79. A method of observing a sample using a multi-beam apparatus, the method comprising:
   focusing a plurality of beamlets, using a first lens, to form a plurality of images of a charged-particle source on an image plane formed closer to the first lens than a charged-particle separator; and
   projecting the plurality of images, using an objective lens, onto a sample and form a plurality of probe spots thereon.
80. The method of clause 79, further comprising deflecting at least one of the plurality of beamlets radially outward from a primary optical axis of a primary charged-particle beam and incident on the first lens, using a first deflector array.
81. The method of clause 80, wherein the image plane is formed normal to the primary optical axis of the primary charged-particle beam and between the first lens and the charged-particle separator.
82. The method of any one of clauses 80 and 81, further comprising focusing the primary charged-particle beam using a second lens disposed between the charged-particle source and the first lens.
83. The method of clause 82, further comprising adjusting a location of a principal plane of the second lens along the primary optical axis to adjust probe currents of the plurality of beamlets.
84. The method of any one of clauses 82 and 83, further comprising blocking off a peripheral portion of the primary charged-particle beam using an aperture plate disposed between the charged-particle source and the second lens.
85. The method of clause 84, further comprising forming the plurality of beamlets from the primary charged-particle beam using a second aperture array disposed between the aperture plate and the second lens.
86. The method of any one of clauses 79 to 85, further comprising compensating dispersion caused by the charged-particle separator, using a charged-particle dispersion compensator.
87. The method of any one of clauses 79 to 86, wherein the image plane is formed between the charged-particle dispersion compensator and the first lens.
88. The method of any one of clauses 80 to 87, further comprising limiting probe currents of the plurality of beamlets using a first aperture array disposed between the first deflector array and the charged-particle source.
89. The method of any one of clauses 79 to 88, further comprising adjusting a magnification of the plurality of beamlets by adjusting the first lens.
90. The method of clause 89, wherein adjusting the first lens comprises at least adjusting an electrical excitation of the first lens to change a location of the formed image plane normal to the primary optical axis.
91. The method of any one of clauses 89 and 90, wherein the magnification is determined based on a ratio of a size of one of the plurality of probe spots to a size of a corresponding beamlet of the plurality of beamlets.
92. The apparatus of clause 55, wherein a vertical distance between the image plane and the first lens is less than a vertical distance between the image plane and the charged-particle separator.
93. The apparatus of clause 65, wherein a vertical distance between the image plane and the first lens is less than a vertical distance between the image plane and the charged-particle separator.

In some embodiments, a controller may control a charged particle beam system. The controller may instruct components of the charged particle beam system to perform various functions, such as controlling a charged particle source to generate a charged particle beam and controlling a deflector to scan the charged particle beam across a sample. The controller may also perform various post-processing functions, image acquisition, image subdivision, image processing, generating contours, superimposing, indicators on an acquired image, and the like. The controller may comprise a storage that is a storage medium such as a hard disk, cloud storage, random access memory (RAM), other types of computer readable memory, and the like. The storage may be used for saving scanned raw image data as original images, or for saving post-processed images. The controller may communicate with a cloud storage. A non-transitory computer readable medium may be provided that stores instructions for a processor of controller 19 to carry out beam forming, or other functions and methods consistent with the present disclosure. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

The block diagrams in the figures illustrate the architecture functionality, and operation of possible implementations of systems, methods, and computer hardware or software products according to various exemplary embodiments of the present disclosure. In this regard, each block in a schematic diagram may represent certain arithmetical or logical operation processing that may be implemented using hardware such as an electronic circuit. Blocks may also represent a module, segment, or portion of code that comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. For example, when a condenser lens is configured to form a parallel beam, it may be unnecessary to deflect beams prior to entering beamlet-limit aperture array 121, as in step S720, and thus step S720 may be omitted. Furthermore, steps such as compensating for astigmatism, or others, may be added. It should also be understood that each block of the block diagrams, and combination of the blocks, may be implemented by special purpose hardware-based systems that perform the specified functions or acts, or by combinations of special purpose hardware and computer instructions.

Although the present invention has been explained in relation to some exemplary embodiments, it is to be understood that other modifications and variation may be made without departing the spirit and scope of the invention as hereafter claimed. For example, one or more lenses or other optical components may be added at various points to the particular constructions of exemplary particle-optical system discussed herein. Optical components may be provided for, e.g., magnifying, zooming, and image anti-rotating etc.

What is claimed is:

1. A charged particle optical system comprising:
a first deflector configured to deflect a beamlet of a charged particle beam generated by a charged particle source; and
a first lens configured to focus the beamlet to form an image of the charged particle source on an image plane within a region of a beam separator that is configured to separate the beamlet and secondary charged particles generated from a sample in response to charged particles of the beamlet interacting with the sample.

2. The charged particle optical system of claim 1, wherein the first deflector is configured to deflect the beamlet toward an optical axis of the system.

3. The charged particle optical system of claim 1, wherein the first deflector is configured to deflect the beamlet outward from an optical axis of the system.

4. The charged particle optical system of claim 1, wherein the image plane is formed normal to an optical axis of the system and between the first lens and the beam separator.

5. The charged particle optical system of claim 1, wherein the first deflector is a part of an image-forming element array.

6. The charged particle optical system of claim 1, wherein the first lens comprises a transfer lens.

7. The charged particle optical system of claim 6, wherein the transfer lens is a movable transfer lens and has a principal plane at a predetermined position and is moved along an optical axis of the system.

8. The charged particle optical system of claim 7, wherein the first deflector is configured to deflect the beamlet with a deflection angle that is based on an amount of displacement of the principal plane of the movable transfer lens from the predetermined position.

9. The charged particle optical system of claim 8, wherein the amount of deflection imparted by the first deflector is determined by a voltage applied to the first deflector.

10. A non-transitory computer readable medium that stores a set of instructions that is executable by one or more processors of a controller to cause a charged particle optical system to perform a method of forming a plurality of probe spots on a sample, the method comprising:

focusing a plurality of deflected beamlets to form a plurality of images of a charged particle source on an image plane; and
projecting the plurality of images onto a further plane that is different from the image plane to form the plurality of probe spots on a sample.

11. The non-transitory computer readable medium of claim 10, wherein the set of instructions that is executable by the one or more processors to cause the charged particle optical system to further perform:
separating, by a beam separator, the plurality of deflected beamlets and secondary charged particles generated from the sample in response to charged particles of the plurality of beamlets interacting with the sample.

12. The non-transitory computer readable medium of claim 11, wherein the image plane is within a region of the beam separator.

13. The non-transitory computer readable medium of claim 12, wherein the set of instructions that is executable by the one or more processors to cause the charged particle optical system to further perform:
limiting currents of the plurality of probe spots by a first aperture array.

14. The non-transitory computer readable medium of claim 13, wherein the set of instructions that is executable by the one or more processors to cause the charged particle optical system to further perform:
varying the currents by changing a focusing status of the beam.

15. The non-transitory computer readable medium of claim 14, wherein the set of instructions that is executable by the one or more processors to cause the charged particle optical system to further perform:
trimming, by a second aperture array above the first aperture array, portions of the beam not used in the plurality of probe spots.

16. The non-transitory computer readable medium of claim 15, wherein the second aperture array is close to the source.

17. The non-transitory computer readable medium of claim 12, wherein the set of instructions that is executable by the one or more processors to cause the charged particle optical system to further perform:
changing a pitch of the plurality of probe spots by changing deflection angles of the plurality of beamlets.

18. The non-transitory computer readable medium of claim 12, wherein the set of instructions that is executable by the one or more processors to cause the charged particle optical system to further perform:
changing pitches of the plurality of probe spots by moving a principal plane of the lens.

19. The non-transitory computer readable medium of claim 12, wherein the set of instructions that is executable by the one or more processors to cause the charged particle optical system to further perform:
changing pitches of the plurality of probe spots by moving the image plane.

20. The non-transitory computer readable medium of claim 10, wherein pitches of the plurality of probe spots are different from one another.

* * * * *